United States Patent
Son et al.

(10) Patent No.: US 10,237,651 B2
(45) Date of Patent: Mar. 19, 2019

(54) AUDIO SIGNAL PROCESSING METHOD AND ELECTRONIC DEVICE FOR SUPPORTING THE SAME

(71) Applicant: Samsung Electronics Co., Ltd., Gyeonggi-do (KR)

(72) Inventors: Beakkwon Son, Gyeonggi-do (KR); Gangyoul Kim, Gyeonggi-do (KR); Yangsu Kim, Gyeonggi-do (KR); Chulmin Choi, Seoul (KR); Jinwoo Park, Gyeonggi-do (KR); Gunhyuk Yoon, Gyeonggi-do (KR); Namil Lee, Gyeonggi-do (KR); Yonghoon Lee, Gyeonggi-do (KR); Keunwon Jang, Gyeonggi-do (KR); Seungyoon Heo, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 19 days.

(21) Appl. No.: 15/235,639

(22) Filed: Aug. 12, 2016

(65) Prior Publication Data
US 2017/0048615 A1    Feb. 16, 2017

(30) Foreign Application Priority Data

Aug. 12, 2015   (KR) .................. 10-2015-0113952

(51) Int. Cl.
*H03G 3/20* (2006.01)
*H04R 3/04* (2006.01)
(Continued)

(52) U.S. Cl.
CPC .............. *H04R 3/04* (2013.01); *G10L 19/167* (2013.01); *H03G 3/3005* (2013.01); *H03G 3/32* (2013.01);
(Continued)

(58) Field of Classification Search
CPC .... H04R 3/04; H04R 29/001; H04R 2430/01; G10L 19/167; H03G 3/3005; H03G 3/32; H03G 5/165; H03G 29/001
(Continued)

(56) References Cited

U.S. PATENT DOCUMENTS

| 6,766,176 B1 * | 7/2004 | Gupta ................. H04M 1/6008 455/219 |
| 2005/0049734 A1 * | 3/2005 | Kim ..................... G11B 27/034 700/94 |

(Continued)

FOREIGN PATENT DOCUMENTS

| WO | WO 2013/102799 | * | 7/2013 |
| WO | WO 2014/035845 | | 3/2014 |

OTHER PUBLICATIONS

European Search Report dated Jan. 5, 2017 issued in counterpart application No. 16183827.1-1903, 6 pages.

*Primary Examiner* — Norman Yu
(74) *Attorney, Agent, or Firm* — The Farrell Law Firm, P.C.

(57) ABSTRACT

An audio processing method and an electronic device for supporting the same are provided. The audio signal processing method includes checking property information of an audio signal in response to a request for playing the audio signal; processing, when property information fulfills a first condition, the audio signal using the first method and, when the property information fulfills a second condition, the audio signal using the second method; and outputting the audio signal processed using one of the first and second methods through a speaker.

17 Claims, 16 Drawing Sheets

(51) Int. Cl.
  *H04R 29/00*   (2006.01)
  *G10L 19/16*   (2013.01)
  *H03G 3/32*    (2006.01)
  *H03G 3/30*    (2006.01)
  *H03G 5/16*    (2006.01)
  *H03G 7/00*    (2006.01)

(52) U.S. Cl.
  CPC .......... *H03G 5/165* (2013.01); *H04R 29/001* (2013.01); *H04R 2430/01* (2013.01)

(58) Field of Classification Search
  USPC ......... 381/57, 58, 106, 107, 59, 98, 104, 96, 381/102
  See application file for complete search history.

(56) References Cited

U.S. PATENT DOCUMENTS

| | | | |
|---|---|---|---|
| 2007/0129282 A1 | 6/2007 | Lee et al. | |
| 2009/0097676 A1* | 4/2009 | Seefeldt | H04S 7/00 381/107 |
| 2010/0280638 A1 | 11/2010 | Matsuda et al. | |
| 2011/0184540 A1* | 7/2011 | Huang | H03G 3/301 700/94 |
| 2014/0064507 A1 | 3/2014 | Su et al. | |
| 2014/0341396 A1 | 11/2014 | Isberg et al. | |
| 2016/0211817 A1* | 7/2016 | Krishnaswamy | H03G 3/02 |

* cited by examiner

AUDIO SIGNAL PROCESSING METHOD AND ELECTRONIC DEVICE FOR SUPPORTING THE SAME

PRIORITY

This application claims priority under 35 U.S.C. § 119(a) to Korean Patent Application No. 10-2015-0113952, filed in the Korean Intellectual Property Office on Aug. 12, 2015, the entire content of which is incorporated herein by reference.

BACKGROUND

1. Field of the Disclosure

The present disclosure relates generally to audio signal processing, and more specifically to an audio processing method and an electronic device for supporting the same.

2. Description of the Related Art

When playing audio through an electronic device having speakers, it is typical to increase gain for increasing audio volume, to compress audio signal for preventing against clipping and saturation, and to use various filters for acquiring headroom and adjusting audio tone.

However, the above-described method for increasing the sound volume of speakers may degrade sound quality. For example, if excessive gain is applied to increase the volume of audio, this may increase noise or cause saturation at the peak frequency.

When sound vibration is caused by the output of audio signal, it may be possible to restrict the output in a predetermined frequency band. However, this restriction may cause a change in tone quality.

Since, according to conventional methods, a fixed audio parameter is applied to an audio signal regardless of the volume level of the audio signal, it is difficult to maintain the volume level of a sound, sound distortion may occur.

SUMMARY

The present disclosure has been made to address the above-mentioned problems and disadvantages, and to provide at least the advantages described below.

In accordance with an aspect of the present disclosure, an audio signal processing method of an electronic device is provided. The audio signal processing method includes checking property information of an audio signal in response to a request to play the audio signal; processing, when the checked property information fulfils a first condition, the audio signal using a first process; processing, when the property information fulfils a second condition, the audio signal using a second process; and outputting the audio signal processed using one of the first and second processes through a speaker.

In accordance with another aspect of the present disclosure, an electronic device is provided. The electronic device includes a memory for storing a first and second methods for processing an audio signal; and a processor functionally connected to the memory, wherein the processor checks property information of an audio signal in response to a request to play the audio signal, processes, when the checked property information fulfils a first condition, the audio signal using a first process, processes, when the property information fulfils a second condition, the audio signal using a second process, and outputs the signal processed using one of the first and second processes through a speaker.

In accordance with still another aspect of the present disclosure, a computer-readable storage medium storing a program for executing an audio signal processing method of an electronic device is provided. The audio signal processing method includes checking property information of an audio signal in response to a request to play the audio signal; processing, when the checked property information fulfils a first condition, the audio signal using a first process; processing, when the property information fulfils a second condition, the audio signal using a second process; and outputting the audio signal processed using one of the first and second processes through a speaker.

DETAILED DESCRIPTION

Figure 1A:
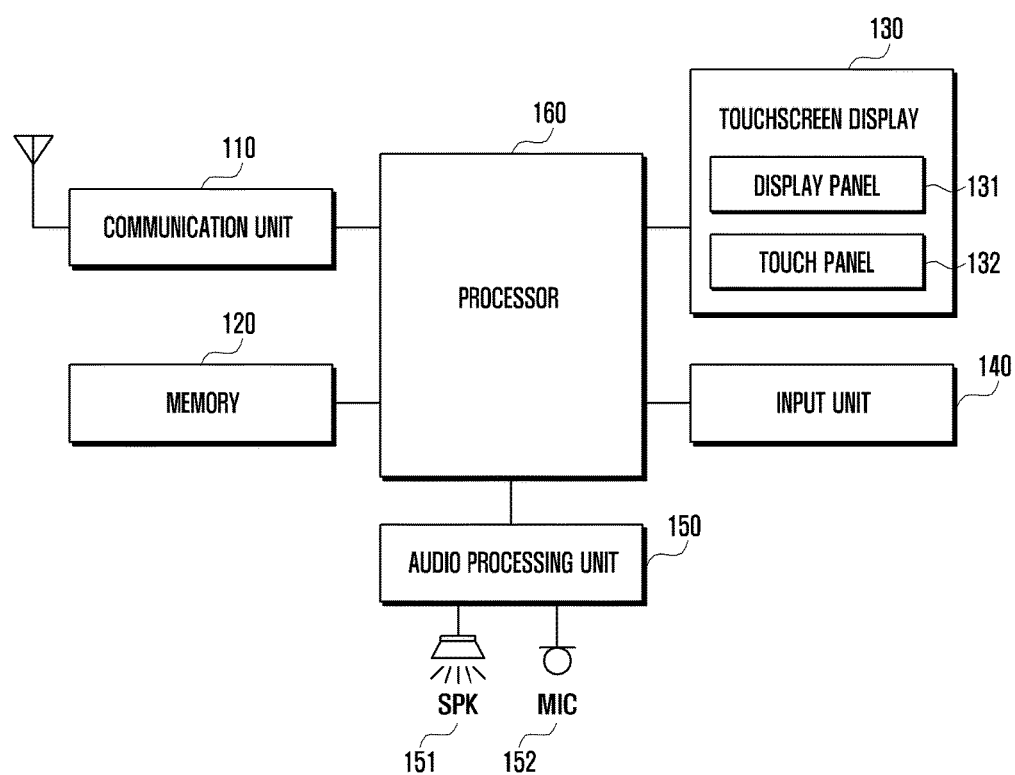
FIG. 1A is a block diagram illustrating a configuration of an electronic device according to embodiments of the present disclosure.

Embodiments of the present disclosure are described in detail with reference to the accompanying drawings. The embodiments and terms used herein are not intended to limit the disclosure but to help understand the present disclosure, and it should be understood that the embodiments of the present disclosure include all changes, equivalents, and/or substitutes within the spirit and scope of the disclosure. The same reference numbers may be used throughout the drawings to refer to the same or similar parts. As used herein, the singular forms "a", "an", and "the" of terms are intended to include the plural forms as well, unless the context clearly indicates otherwise.

As used herein, terms such as "first" and "second" are used to describe various components. However, the components are not defined by these terms. The terms are merely used to distinguish components from each other. For example, a first component may be referred to as a second component, and likewise a second component may also be referred to as a first component, without departing from the present disclosure. When a (first) component is referred to as being "connected" to or "accessed" by another (second) component, the component may be directly connected to or accessed by the other component, or still another (third) component may be interposed between the two components.

In the following description, the expression "configured to" may be interchangeably used with the expressions "suitable for", "having a capability of", "changed to", "made to", "capable of", and/or "designed for" with respect hardware or software. The expression "device configured to" perform a specified function or operation may denote that the device is "capable of" performing the function or operation with other devices or components. For example, when a processor is described as being configured to perform A, B, and C, the processor (e.g., a central processing unit (CPU) and/or an application processor) may be capable of performing corresponding operations by executing software programs dedicated to the corresponding operations.

According to embodiments of the present disclosure, examples of the electronic device may include a smartphone, a tablet personal computer (PC), a mobile phone, a video phone, an electronic book reader, a desktop PC, a laptop PC, a netbook computer, a workstation, a server, a personal digital assistant (PDA), a portable multimedia player (PMP), a moving picture experts group (MPEG) audio layer-3 (MP3) player, a medical device, a camera, and a wearable device. Examples of the wearable device may include an accessory type device (such as, watch, ring, bracelet, ankle bracelet, necklace, glasses, contact lens, and head-mount device (HMD)), a textile or clothes type device (such as electronic clothes), a body-attached type (such as skin pad and tattoo), and a bio-implemented type. Examples of the electronic device may include a television, a digital video disc (DVD) player, an audio player, a refrigerator, an air conditioner, a cleaner, an oven, a microwave oven, a laundry machine, an air purifier, a set-top box, a home automation control panel, a security control panel, a media box, a game console, an electronic dictionary, an electronic key, a camcorder, and an electronic frame.

According to an embodiment of the present disclosure, examples of the electronic device may include a medical device (such as portable medical sensors (including a glucometer, a heart rate sensor, a tonometer, and a body thermometer), a magnetic resonance angiography (MRA) device, a magnetic resonance imaging (MRI) device, a computed tomography (CT) device, a camcorder, and a microwave scanner), a navigation device, a global navigation satellite system (GNSS), an event data recorder (EDR), a flight data recorder (FDR), an automotive infotainment device, marine electronic equipment (such as a marine navigation system and a gyro compass), aviation electronics (avionics), an automotive head unit, an industrial or household robot, an automatic teller machine (ATM), a point of sales (POS) terminal, and an internet-of-things (IoT) device (such as an electric bulb, a sensor, a sprinkler system, a fire alarm system, a temperature controller, a street lamp, a toaster, fitness equipment, a hot water tank, a heater, and a boiler). Examples of the electronic device may include furniture, a building/structure, a part of a vehicle, an electronic board, an electronic signature receiving device, a projector, and a sensor (such as water, electricity, gas, and electric wave meters). According to embodiments of the present disclosure, the electronic device may be flexible or a combination of at least two of the aforementioned devices. The electronic device is not limited to the aforementioned devices. In the present disclosure, the term "user" may denote a person who uses the electronic device or a device (e.g., artificial intelligence electronic device) which uses the electronic device.

The audio signal processing methods and the electronic devices for supporting the same according to embodiments of the present disclosure are capable of outputting maximum volume at a maximum volume level, in detection of the audio signal, and applying at other volume levels the audio parameter which compensates for the excessive signal processing applied at the maximum volume level. The audio signal processing methods and the electronic devices for supporting the same according to embodiments of the present disclosure are capable of reducing the distortion in volume and quality of audio signals.

FIG. 1A is a block diagram illustrating a configuration of an electronic device according to embodiments of the present disclosure.

Referring to FIG. 1A, the electronic device according to embodiments of the present disclosure may include a communication unit 110, a memory 120, a touchscreen display 130, an input unit 140, an audio processing unit 150, and a processor 160.

The communication unit 110 may make a connection with another electronic device. For example, the communication unit 110 may establish a wireless or a wired communication link to a network for communication with another electronic device. The wireless communication link may be one of a Wi-Fi link, a bluetooth (BT) link, and a near field communication (NFC) link. The wireless communication link may also be a cellular communication link (e.g., long term evolution (LTE), LTE-advanced (LTE-A), code division multiple access (CDMA), wideband CDMA (WCDMA), universal mobile telecommunications system (UMTS), wireless broadband (WIBro), and global system for mobile communications (GSM) links). The wired communication link may be one of a universal serial bus (USB) link, a high definition multimedia interface (HDMI) link, a recommended standard 232 (RS-232) link, and a plain old telephone service (POTS) link.

According to embodiments of the present disclosure, the communication unit 110 may communicate audio and video files with another electronic device. The communication unit 110 may receive a call request or incoming ring tone from another electronic device. The ringtone corresponding to the incoming call received by the communication unit 110 may be output through an audio output device (e.g., speakers) after an audio parameter and volume gain corresponding to the volume level is applied thereto.

The memory 120 may include a program memory region for storing the Operating System of the electronic device and a data memory region for storing data generated while the Operating System is running.

According to embodiments of the present disclosure, the memory 120 may store various information and programs necessary for acquiring the audio parameter corresponding to the audio volume level. The memory 120 may store an audio parameter table which maps the audio volume levels and audio parameters.

The memory 120 also may store a volume gain table that maps audio volume levels to volume gains.

The memory 120 may also store a program for collecting external audio and measuring the size (or level) of the collected external audio and a program for acquiring the audio volume level according to the size of the measured external audio. The memory 120 may also store an external audio level table that maps external audio sizes (or level) to audio volume levels.

The touchscreen display 130 may include a display panel 131 and a touch panel 132 which are integrated to form a whole. The display panel 131 may display various screens during the use of the electronic device under the control of the processor 160. The display panel 131 may be implemented with one of a liquid crystal display (LCD), an organic light emitting diode (OLED), an active matrix OLED (AMOLED), a flexible display, a curved display, and a 3-dimensional (3D) display. The display panel 131 may also be implemented so as to be flexible, transparent, and/or wearable. The touch panel 132 may be a hybrid touch panel equipped with a hand touch panel capable of sensing a hand gesture and a pen touch panel capable of sensing a pen gesture.

According to embodiments of the present disclosure, the display panel 131 may display a volume control menu. The volume control menu may include a minimum volume item, a maximum volume item, and a current volume item. For example, the display panel 131 may display the volume control menu in the form of a bar. The display panel 131 may also display a notification informing of increase or decrease of audio volume level.

According to embodiments of the present disclosure, the touch panel 132 may detect a touch input for increasing or decreasing the currently configured audio volume level. For example, the touch panel 132 may detect a touch input made for increasing or decreasing the current volume level by means of the volume control menu displayed at a part of the screen. The touch panel 132 may also detect a touch input made for controlling the volume level in the state that the volume control menu is not displayed. For example, the touch panel 132 may detect a touch input, e.g., a drag gesture made in a vertical direction, for increasing or decreasing the volume level on a music or video playback screen.

The input unit 140 may include a plurality of input keys for receiving alphanumeric information and a plurality of function keys for configuring and executing various functions. The function keys may include direction keys configured to execute predetermined functions, volume keys, and shortcut keys. The input unit 140 may also generate key signals related to a user configuration and function control of the electronic device to the processor 160. The input unit 140 may be implemented with one or a combination of a 3*4 keypad, a 4*3 keypad, a ball joystick, an optical joystick, a wheel key, a touch key, a touch pad, and a touchscreen. When the input unit 140 is implemented in the form of a full touchscreen, the electronic device may include restricted function keys such as volume keys for increasing and decreasing sound volume, a power key for power-on/off, a menu key, a cancel key, and a home key.

According to embodiments of the present disclosure, the input unit 140 may receive an audio volume level input and transfer a corresponding input signal to the processor 160.

The audio processing unit 150 may connect to a speaker (SPK) 151 which outputs audio signals included in an outgoing or incoming ring tone during a call or audio signals decoded during the playback of an audio file stored in the memory 120 and a microphone (MIC) 152 which collects human voice and other sounds. For example, the audio processing unit 150 may output the audio signals according to the playback of audio and video files and game execution through the speaker 151.

According to embodiments of the present disclosure, the audio processing unit 150 may output the audio signals through the speaker 151 according to a configured volume level and/or volume step. For example, the audio processing unit 150 may output the audio signals included in an incoming ringtone, a music file, or a video file through the speaker 151 at a configured volume level. The audio processing unit 150 may also output the audio signals through the speaker 151 at a volume level input by means of the input unit 140 under the control of the processor 160. The audio processing unit 150 may also receive the audio parameters corresponding to the volume level of the audio signals and process the audio signals by applying the audio parameters.

According to embodiments of the present disclosure, the audio parameters may include a gain, an equalizer (EQ), a bass enhancer, a sound retrieval system (SRS), a sound booster, a dynamic booster, a 3D sound, a reverberation, a noise canceller, an acoustic echo control (AEC), an auto gain control (AGC), a noise suppression (NS), a sample rate, a codec type, a voice enhancer, and a filter.

According to embodiments of the present disclosure, the microphone 152 may collect external audio, i.e., ambient noise. The electronic device may have multiple microphones 152. In this case, the audio processing unit 150 may collect external audio using the microphones with the exception of the microphone which is in use for the call during the call or music playback.

The processor 160 may include at least one of a central processing unit (CPU), an application processor (CP), and a Communication Processor (CP). The processor 160 may perform computation related to the control and/or communication of at least one of the components and data processing.

According to embodiments of the present disclosure, the processor 160 may identify an audio signal and check property information of the audio signal. The property information may include audio channel information (e.g., 1 channel, 2 channels, 4 channels, and 5.1 channels), audio quality information (e.g., number of bits (16 bits, 24 bits, and 40 bits)), and audio type information (e.g., voice and music). Descriptions are made under the assumption that the property information of the audio signal is volume level.

For example, if an audio signal is received through the microphone 152 or output through the speaker 151, the processor 160 determines that the audio signal is detected. If the audio signal is detected, the processor 160 may check the volume level input by means of the input unit 140 and determines the audio parameter corresponding to the volume level. For example, the processor 160 may determine the audio parameter corresponding to the volume level based on the audio parameter table stored in the memory 120. The audio parameter table may map the audio parameter value (e.g. digital gain, filter, and AGC) per volume level. The processor 160 may process the audio signal by applying the audio parameter thereto. The processor 160 may apply the volume gain corresponding to the volume level to the audio signal and then output the audio signal through the speaker 151.

According to embodiments of the present disclosure, if the audio signal is detected, the processor 160 may perform a first audio signal process on the audio signal to increase the audio volume so as to reduce the audio quality in a dynamic range. After the first audio signal process, the processor 160 may optimize the audio parameter values according to the volume level based on the processed audio signal and then perform a second audio signal process. The processor 160 may apply the volume gain corresponding to the volume level to the audio signal on which the second audio signal process has been performed and output the processed audio signal through the speaker 151.

According to embodiments of the present disclosure, if the audio signal is detected, the processor 160 may analyze an external audio level. The processor 160 may collect external audio continuously or periodically by means of the microphone 152 to measure the level of the external audio. The processor 160 may change the volume level of the audio signal according to the external audio level. That is, the processor 160 may adjust the volume level according to the ambient noise size (or level).

Figure 1B:
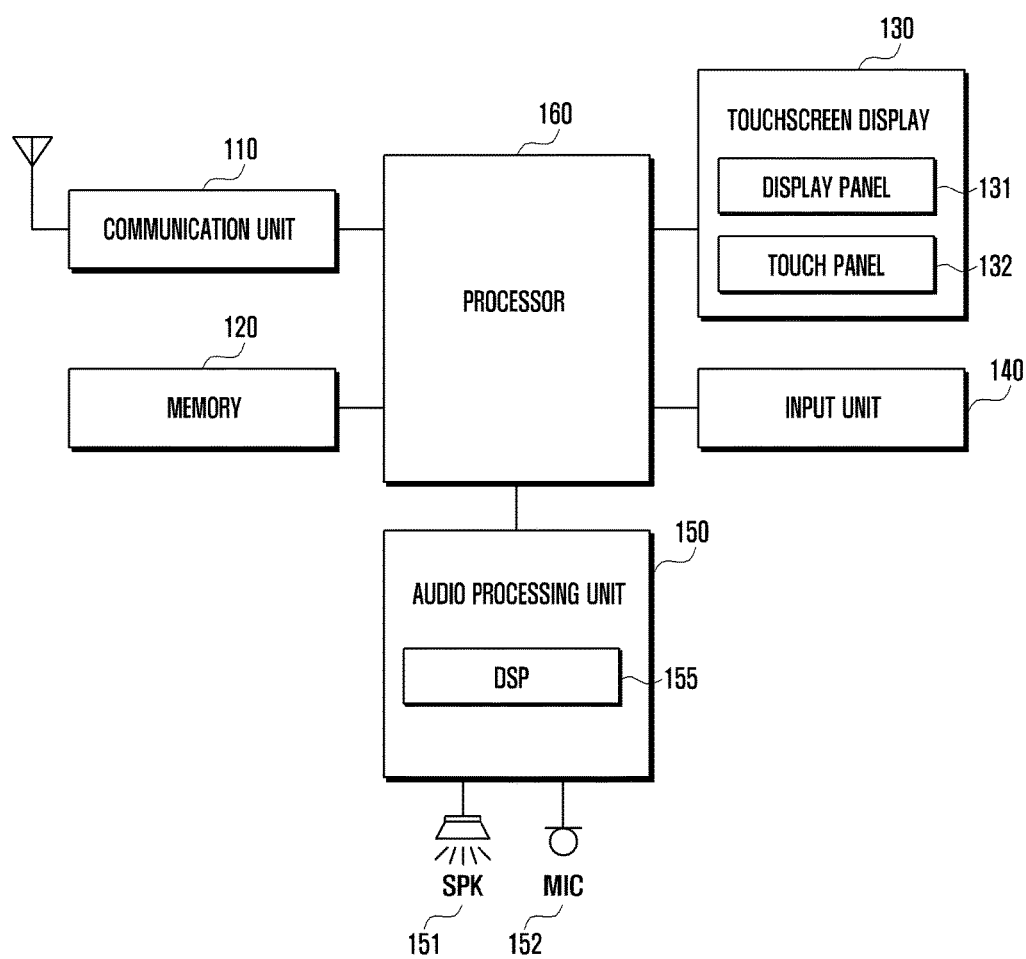
FIG. 1B is a block diagram illustrating a configuration of an electronic device according to embodiments of the present disclosure.

FIG. 1B is a block diagram illustrating a configuration of an electronic device according to embodiments of the present disclosure.

Referring to FIG. 1B, the electronic device according to embodiments of the present disclosure includes a communication unit 110, a memory 120, a touchscreen display 130, an input unit 140, an audio processing unit 150, and a processor 160.

Since the configurations of the communication unit 110, memory 120, touchscreen display 130, and input unit 140 of the electronic device of FIG. 1B are identical to those of the electronic device of FIG. 1A, detailed descriptions thereof are omitted herein.

The audio processing unit 150 may connect to a speaker (SPK) 151 which outputs audio signals included in an outgoing or incoming ring tone during a call or audio signals decoded during the playback of an audio file stored in the memory 120 and to a microphone (MIC) 152 that collects human voice input and other sounds. For example, the audio processing unit 150 may output the audio signals according to the playback of audio and video files and game execution through the speaker 151.

According to embodiments of the present disclosure, the audio processing unit 150 may include a digital signal processor (DSP) 155.

If an audio signal is detected, the DSP 155 may check the property information concerning the audio signal. According to embodiments of the present disclosure, the property information may include audio channel information (e.g., whether the audio signal includes 1 channel, 2 channels, 4 channels, or 5.1 channels), audio quality information (e.g., number of bits (16 bits, 24 bits, or 40 bits)), and audio type information (e.g., voice or music). Herein, it is assumed that the property information of the audio signal includes volume level information.

The DSP 155 may process the audio signal by applying audio parameters corresponding to a volume level received from the processor 160. The DSP 155 may also apply a volume gain corresponding to the volume level received from the processor 160 to the audio signal processed based on the audio parameters and output the audio signal through the speaker 151. According to embodiments of the present disclosure, if the audio signal is detected, the DSP 155 may perform a first audio signal process on the audio signal to increase the volume while reducing sound quality distortion in a dynamic range. After the first audio signal process, the DSP 155 may optimize the audio parameter values according to the volume level based on the processed audio signal and then perform a second audio signal process. The DSP 155 may apply the volume gain corresponding to the volume level received from the processor 160 to the audio signal on which the second audio signal process has been performed and output the processed audio signal through the speaker 151.

According to embodiments of the present disclosure, if the audio signal is detected, the DSP 155 may analyze an external audio level. For example, the DSP 155 may collect external audio continuously or periodically by means of the microphone 152 to measure the level of the external audio. The DSP 155 may output the audio signal through the speaker 151 according to the measured external audio level. That is, the DSP 155 may output the audio signal through the speaker at a volume level adjusted according to the size (or level) of ambient noise.

The processor 160 may include at least one of a CPU, an application processor (AP), and a communication processor (CP). The processor 160 may perform computation related to the control and/or communication of at least one of the components and data processing.

According to embodiments of the present disclosure, if the measured external audio level is received from the audio processing unit 150, the processor 160 may transfer the signal to the audio processing unit 150. If a user input for adjusting (increasing or decreasing) the volume is detected on the touch panel 132, the processor 160 may output a corresponding volume adjustment signal to the audio processing unit 150. The processor 160 may determine audio parameters corresponding to the volume level by referencing the audio parameter table stored in the memory 120. The processor 160 may also reference the volume gain table stored in the memory to notify the audio processing unit 150 of the volume gain corresponding to the volume level.

According to embodiments of the present disclosure, if the external audio level measured by the audio processing unit 150 is received, the processor may reference the external audio level table stored in the memory 120 to notify the audio processing unit 150 of the audio volume level corresponding to the external audio level The audio processing operation based on the audio parameters and volume gain corresponding to the volume level of the audio signal may be performed by the processor 160 as described with reference to FIG. 1A or by the DSP 155 of the audio processing unit 150 as described with reference to FIG. 1B. According to embodiments of the present disclosure, descriptions are made under the assumption that the processor 160 performs the audio processing operation.

The electronic device may include various sensor modules (such as a global positioning system (GPS) module for receiving location information, an infrared sensor module, and a light sensor module), a camera module for taking still and motion pictures, and a broadcast receiver module for receiving broadcast signals.

Figure 2:
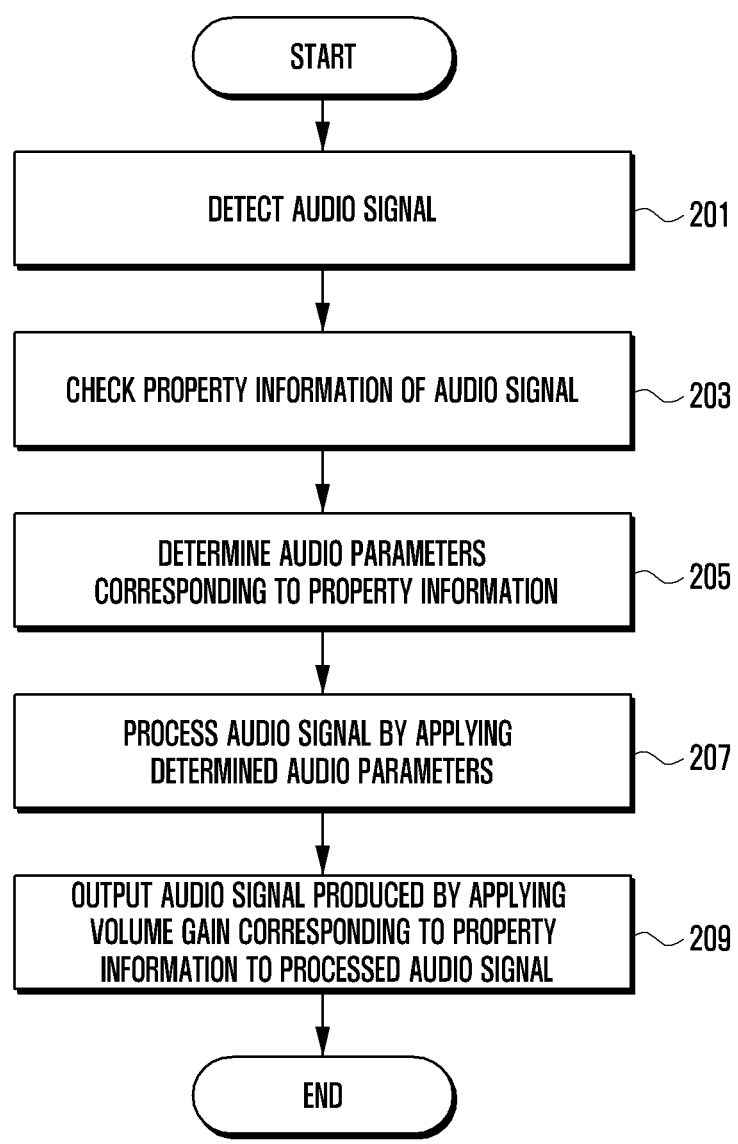
FIG. 2 is a flowchart illustrating an audio signal processing method according to embodiments of the present disclosure.

FIG. 2 is a flowchart illustrating an audio signal processing method according to embodiments of the present disclosure.

Referring to FIG. 2, the processor 160 may detect an audio signal at step 201. According to embodiments of the present disclosure, if an audio signal is input through the microphone 152 or output through an output device, e.g. the speaker 151, the processor 160 may determine that the audio signal is detected. For example, the audio signal detection may be performing during a voice call, a video call, a voice over LTE (VoLTE) call, a voice over internet protocol (VoIP) call, a recoding operation, a voice recognition operation, a music playback operation, a video playback operation, and a game execution operation.

If the audio signal is detected, the processor may check the property information of the audio signal at step 203. According to embodiments of the present disclosure, the property information may include audio channel information (e.g., 1 channel, 2 channels, 4 channels, and 5.1 channels), audio quality information (e.g., number of bits (16 bits, 24 bits, and 40 bits)), and audio type information (e.g., voice and music). Descriptions are made under the assumption that the property information of the audio signal is volume level. The processor may check the volume level of the audio signal. For example, the processor 160 may check the currently configured volume level for output the audio signal. The processor 160 may also check the adjusted volume level upon detection of the volume level adjustment input made through the input unit 140.

The processor 160 may determine the audio parameters corresponding to the property information of the audio signal at step 205. For example, the processor 160 may determine the audio parameters corresponding to the volume level based on the audio parameter table stored in the memory 120. According to embodiments of the present disclosure, the audio parameters may include, but may not be limited to, a digital gain, a filter, and an AGC.

The processor 160 may map different audio parameter values to the volume levels and store the mappings in the memory 120. For example, the processor 160 may apply digital gain corresponding to the volume level of the audio signal to increase or decrease the volume of the audio signal. The processor 160 may apply a filter corresponding to the volume level of the audio signal to increase or decrease the energy in a predetermined frequency band. The processor 160 may adjust the dynamic range corresponding to the volume level of the audio signal in such a way of increasing the dynamic range when the energy level of the input audio signal is greater than a predetermined energy level and of decreasing the dynamic range when the energy level of the input signal is equal to or less than the predetermined energy level.

At step 207, the processor 160 may process the audio signal by applying the audio parameter determined at step 205. According to embodiments of the present disclosure, the electronic device may apply the audio parameters to the volume level of the audio signal dynamically other than fixedly so as to provide the user with the high quality sound without distortion.

The processor may apply the volume gain corresponding to the property information of the audio signal to the audio signal processed with the audio parameters and output a resulting signal at step 209. According to embodiments of the present disclosure, the processor 160 may determine the volume gain corresponding to the volume level of the audio signal by referencing the volume gain table and output the audio signal to which the volume gain is applied through the speaker 151.

Figure 3:
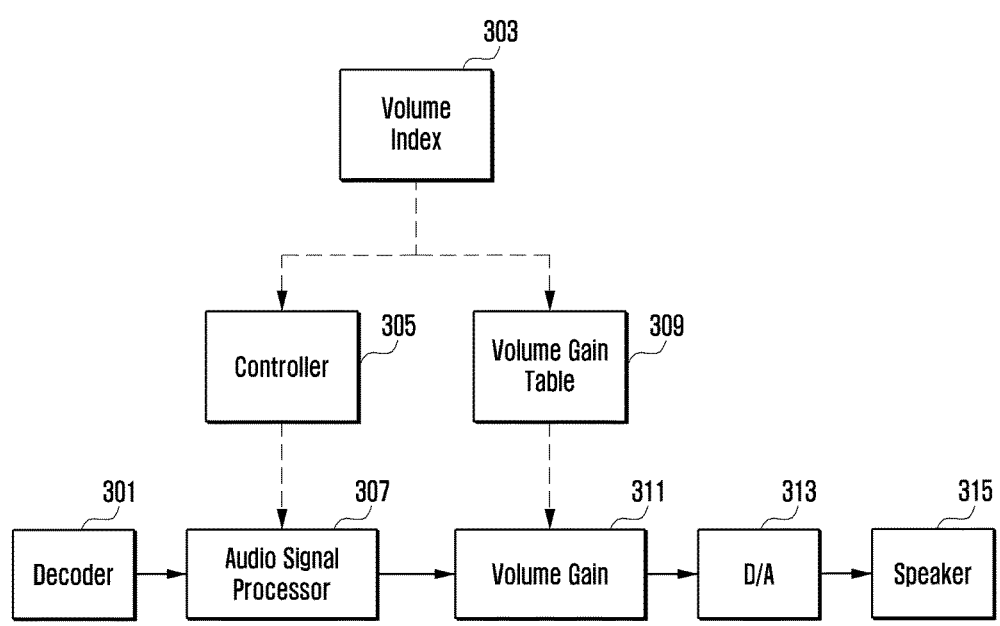
FIG. 3 is a block diagram illustrating a configuration of the electronic device for processing an audio signal according to embodiments of the present disclosure.

FIG. 3 is a block diagram illustrating a configuration of an electronic device for processing an audio signal according to embodiments of the present disclosure.

Referring to FIG. 3, the electronic device according to embodiments of the present disclosure may include a decoder 301, a volume index 303, a controller 305, an audio signal processor 307, a volume gain table 309, a volume gain unit 311, a digital-to-analog converter (D/A) 313, and a speaker 315.

When performing audio playback, the decoder 301 may decompress a compressed file such as MP3 file into a digital signal in a pulse code modulation (PCM) format that is transferred to the audio signal processor 307.

The decoder 301 may decode a bit stream according to the same audio format standard as that used by an audio contents provider. Examples of the audio format standard may include MPEG 1 layer 2, MPEG 2 layer 2, bit-sliced arithmetic coding (B SAC) for terrestrial digital multimedia broadcasting (DMB), advanced audio coding (AAC) for satellite DMB, and audio code number 3 (AC-3) for high definition television (HDTV) broadcast.

If a currently configured volume level information or an input for adjusting the volume level configured currently under the control of the processor 160 is detected, the volume index 303 may send the adjusted volume level information to the controller 305 and the volume gain table 309.

The controller 305 may send the audio signal processor 307 an audio parameter value determined based on the volume level received from the volume index 303. According to embodiments of the present disclosure, the controller 305 may include a digital gain controller, a filter controller, and an AGC controller. Descriptions are made below of the aforementioned components in detail with reference to FIG. 5.

The audio signal processor 307 may process the audio signal by applying the audio parameters received from the controller 305 to the PCM audio signal decoded by the decoder 301. The audio signal processor 307 may send the volume gain unit 311 the audio signal to which the audio parameters are applied.

According to embodiments of the present disclosure, the audio signal processor 307 may include a digital gain module, a filter, and an AGC module. The aforementioned components are described in detail herein with reference to FIG. 4.

The volume gain table 309 may have different volume gain values corresponding to respective volume levels of the audio signal. The volume gain table 309 may check the volume gain value corresponding to the volume level received from the volume index 303 and send the checked volume gain value to the volume gain unit.

The volume gain unit may adjust the final output volume by applying the volume gain value received from the volume gain table 309 to the audio signal processed by the audio signal processor 307. According to embodiments of the present disclosure, the processor 160 may apply 0 dB for the maximum volume level of the audio signal and a volume gain less than 0 dB for the volume level lower than the maximum volume level such that the sound volume decreases as the volume level decreases.

The D/A 313 may convert the PCM digital signal, e.g. the audio signal to which the volume gain value retrieved from the volume gain table 309, to an analog signal, which is transferred to the speaker 315.

The speaker 315 may output the analog electronic signal in the form of an input acoustic signal.

The above audio signal processing method is described hereinafter with reference to Tables 1 and 2.

TABLE 1

| | ASP | | | | | |
|---|---|---|---|---|---|---|
| | Prior art | | | Proposed method | | |
| | Maximum volume | Intermediate volume | Minimum volume | Maximum volume | Intermediate volume | Minimum volume |
| Digital Gain | 15 dB | 15 dB | 15 dB | 15 dB | 6 dB | 2 dB |
| Filter | 500 Hz Cutoff | 500 Hz Cutoff | 500 Hz Cutoff | 500 Hz Cutoff | 200 Hz Cutoff | No filter |
| AGC Compressor | −2 dB | −2 dB | −2 dB | −2 dB | −1 dB | 0 dB |
| Volume Gain | 0 dB | −6 dB | −15 dB | 0 dB | −2 dB | −8 dB |

Table 1 shows outputs of the audio processor 307 and volume gain unit 311 according to the volume level of the audio signal in the prior art and present disclosure.

Referring to Table 1, the processor 160 according to embodiments of the present disclosure may apply a low gain, an alleviated filter, and a non-excessive compressor setting value to the audio signal in comparison with the prior art at the volume levels lower than the maximum volume level. This means that the audio signal processing method of the present disclosure may output an audio signal with reduced audio quality distortion.

In contrast to other conventional methods in which the total gain (=digital gain+volume gain) of 9 dB is applied to the audio signal at the intermediate volume level, the total gain of 4 dB can be applied in embodiments of the present disclosure. It is possible to increase the same amount of audio volume as in the prior art by applying the gain of 4 dB to the audio signal at the intermediate volume level. This is because the proposed method is capable of reducing the volume loss by removing the frequency band below 200 Hz, compared with the prior art in which the frequency band below 500 Hz of the audio signal is removed using a filter.

In contrast to other conventional methods in which the audio signal processor 307 applies the same parameter value at the maximum, intermediate, and minimum volumes, the audio signal processing method according to embodiments of the present disclosure applies different parameter values at the maximum, intermediate, and minimum volumes so as to address audio quality distortion and loud sound at a low volume level.

TABLE 2

| | Volume Gain in prior art | Volume Gain in proposed method |
|---|---|---|
| Volume Index 6 | 0 dB | 0 dB |
| Volume Index 5 | −3 dB | −1 dB |
| Volume Index 4 | −6 dB | −2 dB |
| Volume Index 3 | −9 dB | −4 dB |
| Volume Index 2 | −12 dB | −6 dB |
| Volume Index 1 | −15 dB | −8 dB |

Table 2 is a volume gain table 309 in which volume gains are mapped to volume levels of audio signals for use in the conventional methods and according to the methods according to the present disclosure.

According to embodiments of the present disclosure, the audio signal processor 307 may apply the volume gain value corresponding to the volume level in the volume gain table 309 to the audio signal processed by the audio signal processor 307.

In contrast to conventional methods in which the volume gain values are spaced at a regular interval of 3 dB, the audio signal processing method according to embodiments of the present disclosure applies different volume gain values corresponding to the volume levels of the audio signal to output the audio signal with reduced voice quality distortion.

Although the embodiments of the present disclosure have been described using specific audio parameter and volume gain values as shown in Tables 1 and 2 and specific terms such as volume gain table to help understand the present disclosure, it is obvious to those skilled in the art that the audio parameter and volume gain values of the tables can be changed depending on the situation.

Figure 4:
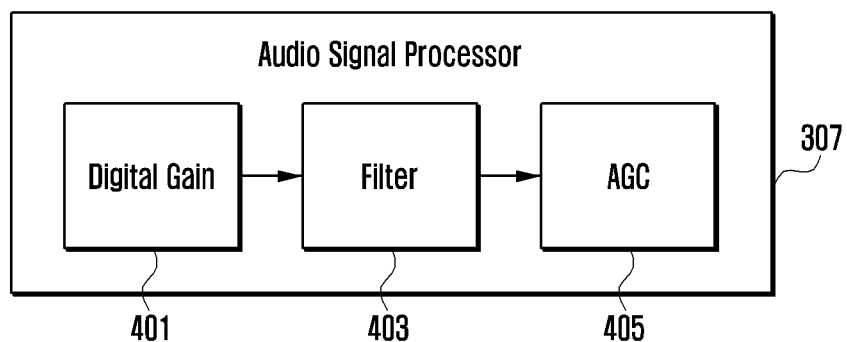
FIG. 4 is a block diagram illustrating a configuration of the audio signal processor of FIG. 3.

FIG. 4 is a block diagram illustrating a configuration of the audio signal processor of FIG. 3.

Referring to FIG. 4, the audio signal processor 307 may include a digital gain module 401, a filter 403, and an AGC 405. Although the description is directed to a case where the audio signal is processed by the digital gain module 401, the filter 403, and the AGC 405 in series, the present disclosure is not limited thereto.

The digital gain module 401 may apply a value corresponding to the volume level to a PCM audio signal to increase or decrease the audio volume.

The filter 403 may apply a filter corresponding to the volume level to decrease or increase energy in a predetermined frequency band of the PCM audio signal.

The AGC 405 may apply an AGC value corresponding to the volume level to adjust the dynamic range. The dynamic range denotes difference (ratio) between the sound pressures of the loudest and smallest sounds of the received audio signal. That is, the AGC 405 may adjust the amplification ratio of the audio signal automatically to reach a range of a predetermined level. For example, the AGC 405 may decrease the energy of the audio signal that is greater than a predetermined level and remove the energy of the audio signal that is equal to or less than the predetermined level.

Figure 5:
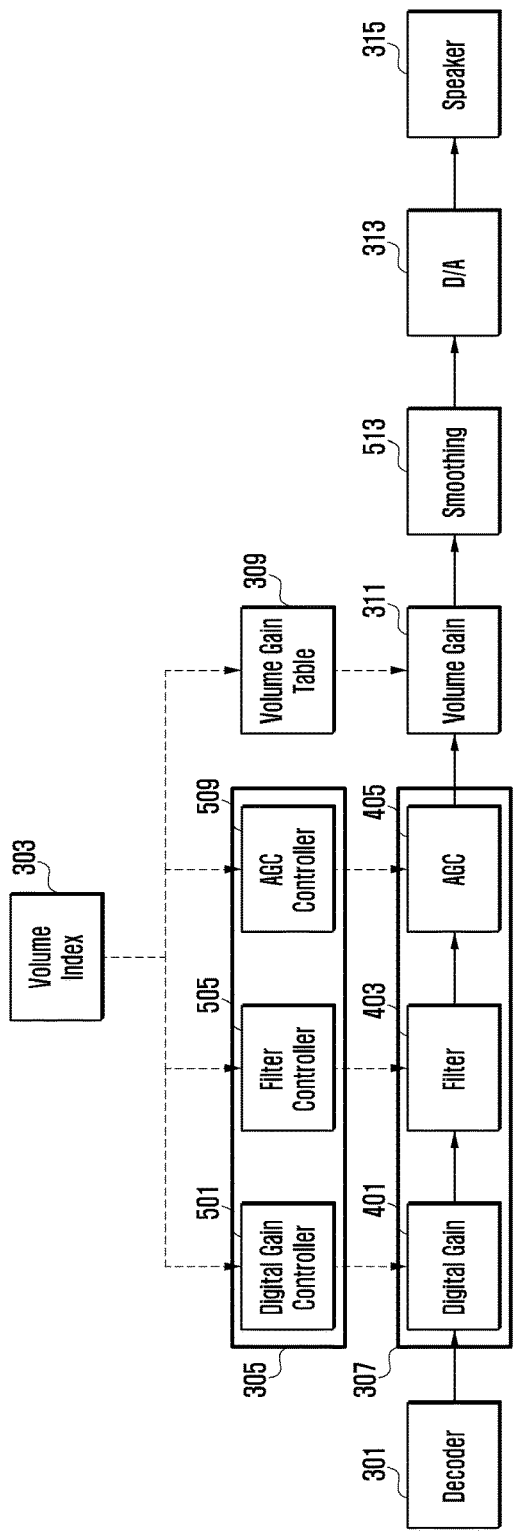
FIG. 5 is a block diagram illustrating a configuration of an electronic device for processing an audio signal according to embodiments of the present disclosure.

FIG. 5 is a block diagram illustrating a configuration of an electronic device for processing an audio signal according to embodiments of the present disclosure.

Further detailed descriptions of the components of the electronic device of FIG. 5 that are identical to those of FIG. 3 or 4 are omitted herein.

Referring to FIG. 5, the digital gain controller 501, the filter controller 505, and the AGC controller 509 may be included in the controller 305 of FIG. 3.

The decoder 301 may decode a compressed file, e.g. MP3 file, into a digital signal in a PCM format, which is sent to the digital gain module 401.

The volume index 303 may check the current volume level. However, the present disclosure is not limited thereto and it may be possible for the volume index 303 to check the adjusted volume level upon detection of an input for adjusting the volume level under the control of the processor 160. The volume index 303 may notify the checked volume level to the digital gain controller 501, filter controller 505, AGC controller 509, and volume gain table 309.

The digital gain controller 501 may send the volume level information received from the volume index 303 to the digital gain module 401 to apply the volume level to the corresponding digital gain. For example, the digital gain controller 501 may control to apply excessive volume gain to the audio signal so as to increase the audio volume at the maximum volume level. As a consequence, the gain balance between the digital gain module 401 and the volume gain unit may be broken. However, it may be possible to control the digital gain module 401 to not apply excessive volume gain at a volume level lower than the maximum volume level. This makes it possible to distribute gain to achieve gain balance between the digital gain module 401 and the volume gain unit.

The digital gain module 401 may apply the digital gain value received from the digital gain controller 501 according to the volume level to the PCM audio signal decoded by the decoder 301.

The filter controller 505 may apply the volume level information received from the volume index 303 to the filter 403 corresponding to the volume level. For example, the filter controller 505 may control the filter 403 to apply a high pass filter for filtering out low band frequencies of the audio signal at the maximum volume level and a filter for cutting a predetermined band so as to mitigate sound vibration. Since it is possible to avoid low band playback failure of a small speaker and sound vibration of the audio signal, the filter controller 505 may apply a mitigation filter to the audio signal. According to embodiments of the present disclosure, the electronic device may apply the mitigation filter to the audio signal at a low volume level to play the original sound.

The filter 403 may process the audio signal by applying a filter corresponding to the volume level received from the filter controller 505 to the audio signal to which the digital gain value has been applied.

The AGC controller 509 may receive the volume level information from the volume index 303 and control the AGC 405 to apply the AGC setting value corresponding to the volume level. For example, since the excessive volume gain is applied to the audio signal at the maximum volume level as described above, the AGC controller 509 may apply the AGC setting value for excessive compression in order to protect against audio signal saturation or maintain the power below the rated power and thus avoid speak breakage. Since the audio signal is output at an audio volume which is not too large to cause saturation or sound vibration, the AGC controller 509 may apply the AGC setting value rounded to reduce the sound quality degradation of the audio signal.

The AGC 405 may process the audio signal by applying the A\GC setting value corresponding to the volume level received from the AGC controller 509 to the audio signal to which the filter 403 has been applied.

The volume gain table 309 may check the volume gain value corresponding to the volume level received from the volume index 303 and notify the volume gain unit of the volume gain value.

The volume gain unit may adjust the final output audio volume by applying the volume gain value received from the volume gain table to the audio signal which has been processed by the audio signal processor 307 (i.e., the digital gain module 401, filter 403, and AGC 405).

According to embodiments of the present disclosure, the electronic device may further include a smoothing unit 513. If the digital gain module 401, filter 403, AGC 405, and volume gain unit are applied to the audio signal in correspondence to the volume level of the audio signal, abrupt discontinuity may cause noise. The smoothing unit 513 may perform smoothing on the audio signal even though the volume level of the audio signal changes.

The D/A may convert the PCM digital signal, i.e. the audio signal processed by the smoothing unit 513, to an analog signal, which is transferred to the speaker 315. The speaker 315 may output the audio signal received from the D/A 313.

Figure 6:
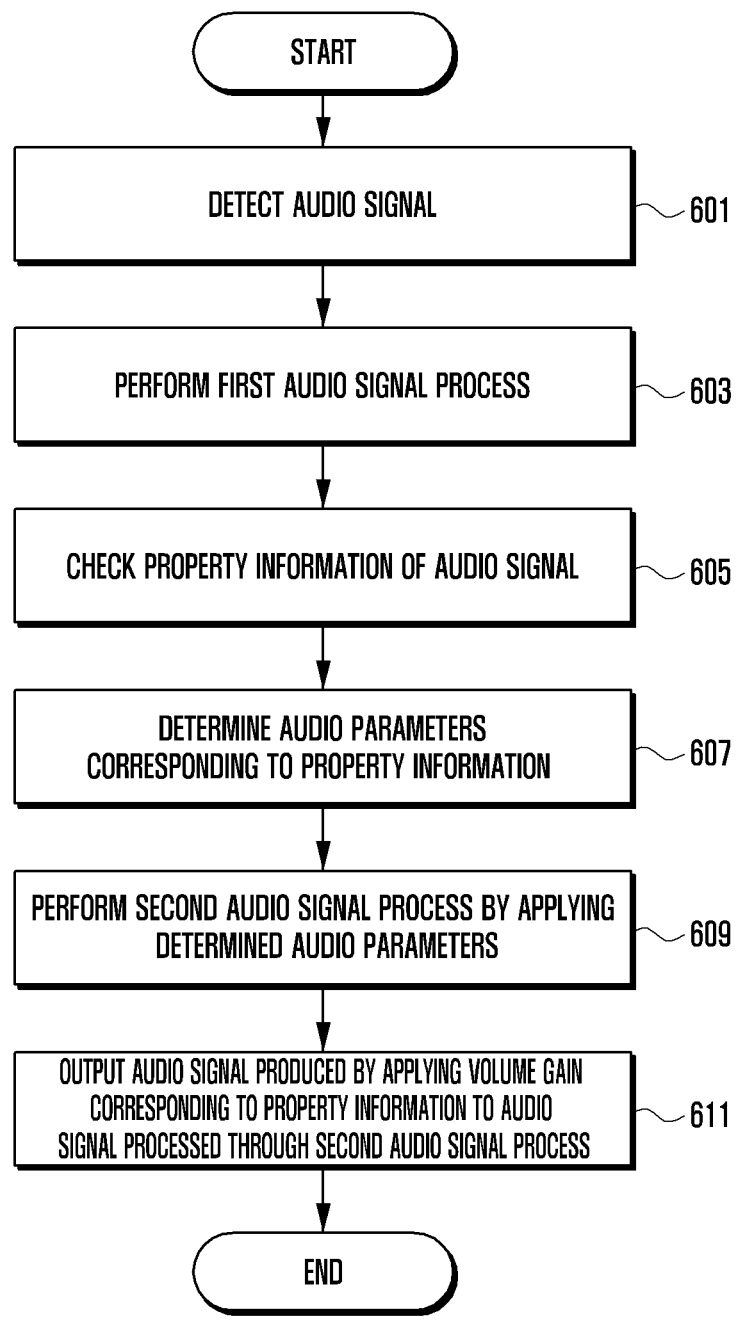
FIG. 6 is a flowchart illustrating an audio signal processing method according to embodiments of the present disclosure.

FIG. 6 is a flowchart illustrating an audio signal processing method according to embodiments of the present disclosure.

According to embodiments of the present disclosure, if the setting values applied to the decoder output signal are in the range from the maximum volume level to the minimum volume level, a large difference occurs in audio parameter values, resulting in sound quality change between the maximum and minimum volume levels. The processor 160 may perform a first audio signal process to overcome the aforementioned problem. After the first audio signal process, the processor 160 may perform a second audio signal process to optimize the audio parameter values per volume level based on the previously processed audio signal. That is, since the first audio processing is performed prior to the second audio signal process, it is possible to apply more rounded audio parameter values in the second audio signal process.

Referring to FIG. 6, the processor 160 may detect an audio signal at step 601. Since step 601 of FIG. 6 is identical to step 201 of FIG. 2, a detailed description thereof is omitted herein. If the audio signal is detected, the processor 160 may perform the first audio signal process at step 603. According to embodiments of the present disclosure, the first audio signal process may be an operation of increasing the audio volume to decrease the audio quality distortion of the audio signal in the dynamic range.

The processor 160 may check the property information of the audio signal at step 605 and determine audio parameters corresponding to the checked property information at step 607. For example, the processor 160 may check the volume level of the audio signal and determine the audio parameters corresponding to the volume level. Since step 607 of FIG. 6 is identical to step 205 of FIG. 2, a detailed description thereof is omitted herein. The processor 160 may perform the second audio signal process by applying the determined audio parameters to the signal processed through the first audio signal process at step 609.

The processor 160 may apply the volume gain corresponding to the property information (e.g., volume level) of the audio signal to the audio signal processed by the second audio processing; thus, the result signal is output through the speaker 151 at step 611. According to embodiments of the present disclosure, the processor 160 may apply the audio parameters and volume gain corresponding to the volume level of the audio signal to output the result signal through the speaker 151.

Figure 7:
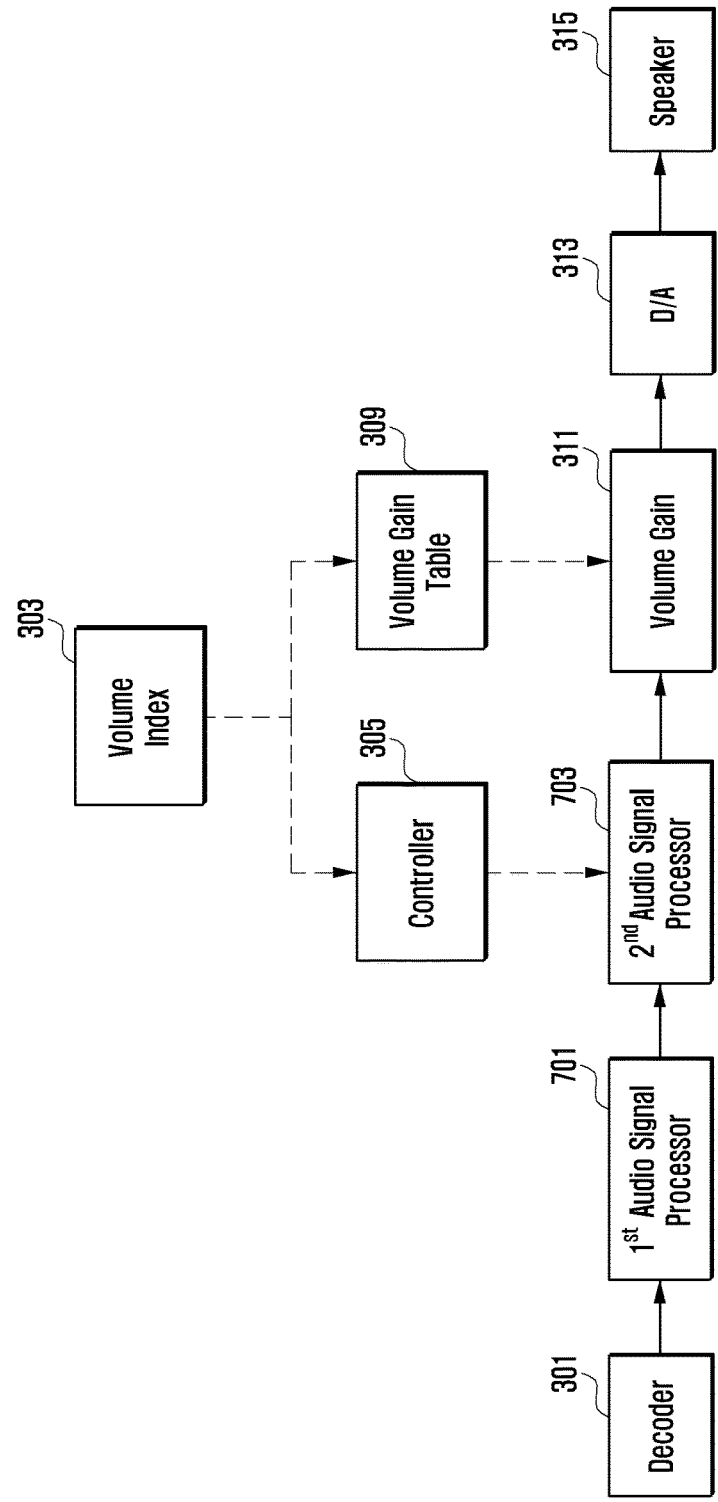
FIG. 7 is a block diagram illustrating a configuration of an electronic device for processing an audio signal according to embodiments of the present disclosure.

FIG. 7 is a block diagram illustrating a configuration of an electronic device for processing an audio signal according to embodiments of the present disclosure.

Further detailed descriptions of the components of the electronic device of FIG. 7 that are identical to those of the electronic device of FIG. 3, are omitted herein.

Referring to FIG. 7, a first audio signal processor 701 may process the audio signal input from the decoder 301. For example, the first audio signal processor 701 may apply a volume amplification solution to reduce audio quality distortion. The first audio signal processor 701 may optimize gain, filter, and AGC values in the volume amplification solution so as to minimize saturation of the audio signal in the dynamic range.

A second audio signal processor 703 may process the audio signal output from the first audio signal processor 701. The second audio signal processor 703 may operate in the same way as the audio signal processor 307 of FIG. 3. More specifically, the second audio signal processor 703 may apply the audio parameters received from the controller 305 to the audio signal received from the first audio signal processor 701.

The volume gain table 309 may provide the volume gain unit with a volume gain value corresponding to the volume level received from the volume index 303.

The volume gain unit may adjust the final output audio volume by applying the volume gain value received from the volume gain table 309 to the audio signal received from the second audio signal processor 703.

The D/A 313 may convert the PCM digital signal, i.e. the audio signal to which the volume gain value received from the volume gain table 309 is applied, to an analog signal, which is transferred to the speaker 315. The speaker 315 may output the audio signal received from the D/A 313.

Figure 8A:
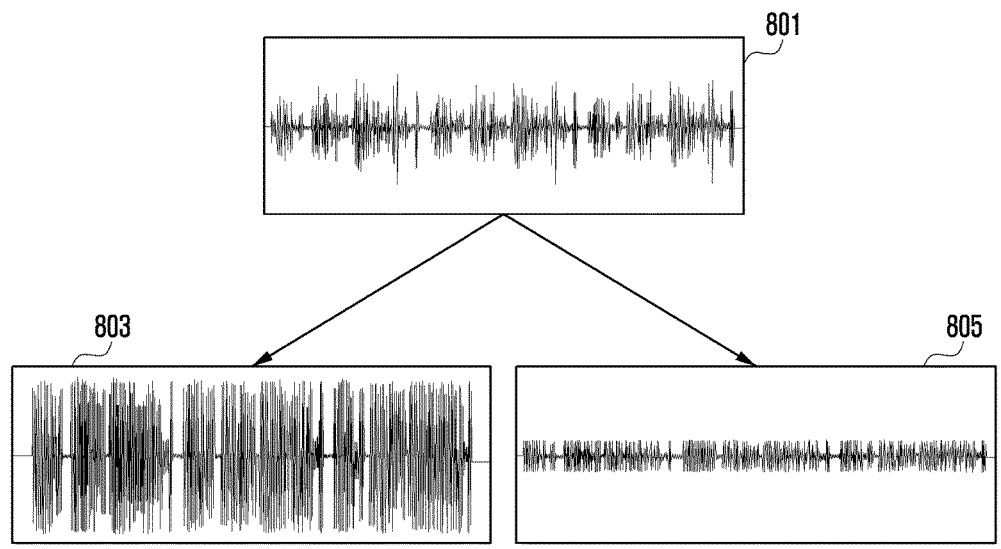
FIG. 8A is a diagram illustrating a conventional audio signal processing mechanism.

FIG. 8A is a diagram illustrating a conventional audio signal processing mechanism.

Referring to FIG. 8A, the conventional method processes the audio signal in such a way of clipping the PCM audio signal 801 output from the decoder 301 in the dynamic range and applies excessive volume gain as denoted by reference number 803 in order to increase the audio volume at the maximum volume level. However, the conventional method has a drawback in that the excessive volume gain increases noise or causes gain saturation at the peak value.

Also, the conventional method processes the audio signal in such a way of decreasing only the volume gain for the maximum volume level at the volume levels below the maximum volume level; thus, the audio signal maintains the waveform characteristics of the maximum volume level as denoted by reference number 805. As a consequence, the audio quality degradation problem caused by increasing the audio volume at the maximum level occurs even at the volume levels below the maximum volume level.

Figure 8B:
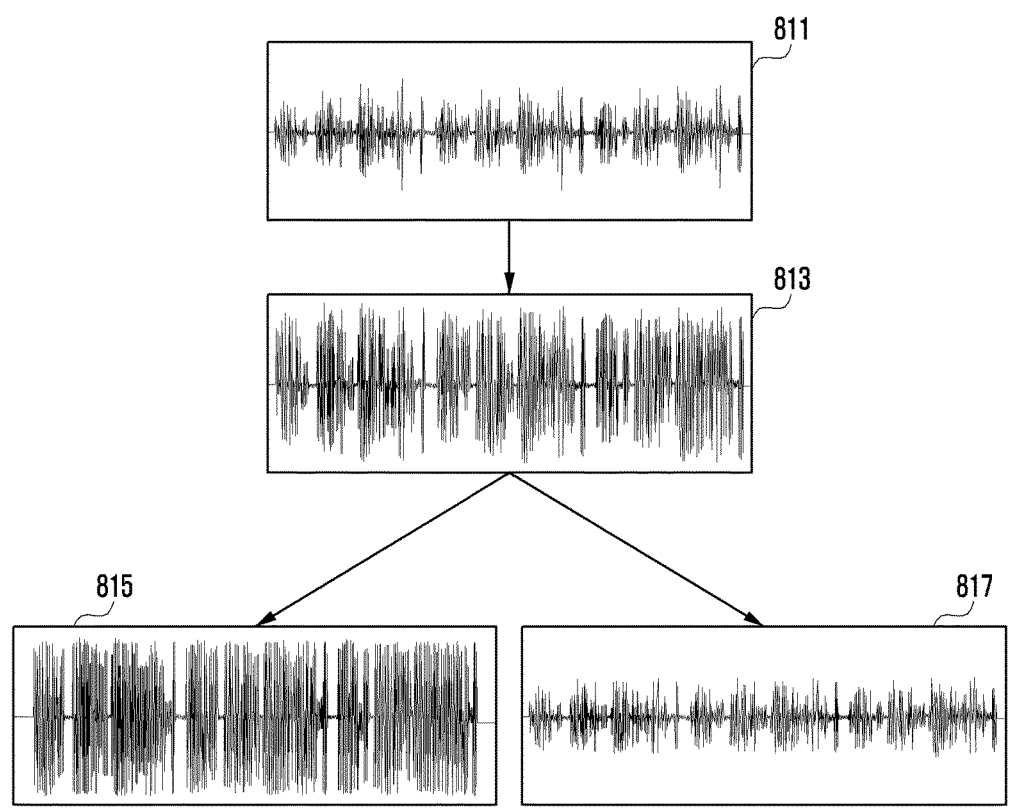
FIG. 8B is a diagram illustrating an audio signal processing mechanism according to embodiments of the present disclosure.

FIG. 8B is a diagram illustrating an audio signal processing mechanism according to embodiments of the present disclosure.

Referring to FIG. 8B, the processor 160 may perform a first audio signal process on the PCM audio signal output from the decoder 301 as denoted by reference number 811 to increase the audio volume without distortion in the dynamic range as denoted by reference number 813. For example, the processor 160 may control to apply a gain as high as a level of digital headroom, a minimum low band filter (equal to or lower than 100 Hz), and an AGC compressor threshold as high as a level of −2 dB to the PCM audio signal 811 so as to protect against audio quality distortion.

The first audio signal process to obtain the signal 813 is an operation of optimizing the audio parameters including the gain, filter, and AGC without clipping the PCM audio signal 811, e.g. applying the digital gain of 8 dB, 100 Hz cutoff High pass filter, and AGC Compressor of 1 dB. Through this audio processing operation, it is possible to reduce the audio quality distortion of the audio signal at both the maximum and minimum volume levels, respectively, as denoted by reference numbers 815 and 817.

The electronic device according to embodiments of the present disclosure is capable of overcoming the problem of the conventional method, i.e. the noise amplification and saturation at the peak value that are caused by clipping the audio signal in the dynamic range and applying an excessive volume gain to the audio signal to increase the audio volume at the maximum volume level, by performing the first audio signal process to produce a signal as denoted by reference number 813. Also, the electronic device according to embodiments of the present disclosure is capable of overcoming the problem of the conventional method, i.e. audio quality degradation occurring at the volume levels below the maximum volume level, by applying audio parameters corresponding to the volume level determined based on the signal processed through the first audio signal process.

Figure 8C:
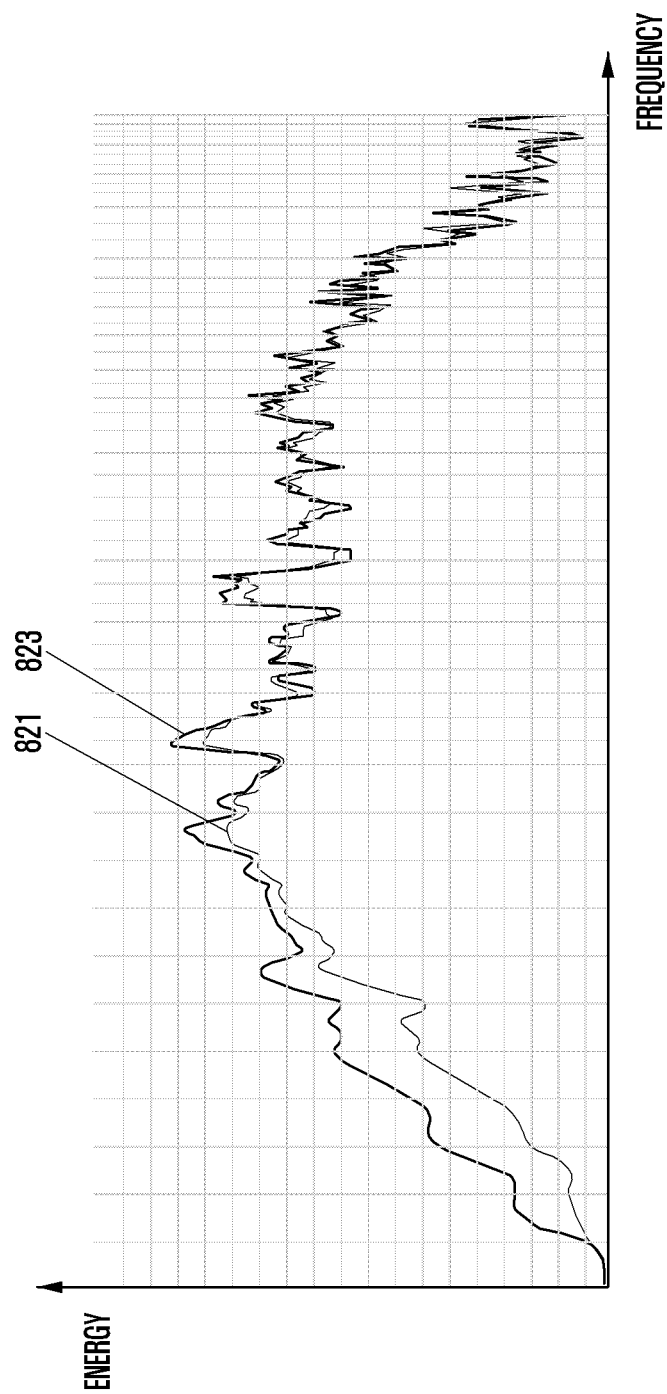
FIG. 8C is a graph illustrating a comparison in audio signal frequency characteristics between the conventional method and the proposed method.

FIG. 8C is a graph illustrating a comparison in audio signal frequency characteristics between the conventional method and the proposed method.

In FIG. 8C, reference number 821 denotes an energy curve of the audio signal according to the conventional method, and frequency number 823 denotes an energy curve of the audio signal according to embodiments of the present disclosure.

In FIG. 8C, the x axis represents frequency, and the y axis represents energy (e.g., volume power); since the conventional method decreases only the volume gain corresponding to the maximum volume level audio signal even for the audio signal at the volume levels below the maximum volume, the audio signal maintains the waveform characteristics of the maximum volume level. Thus the audio quality degradation problem caused by increasing the audio volume at the maximum level occurs even at the volume levels below the maximum volume level. However, the audio processing method of the present disclosure is capable of reducing the audio quality distortion even at the minimum volume level by applying the audio parameters including the gain, filter, and AGC optimized to the audio signal.

FIG. 8C shows that the audio signal energy according to the proposed method is higher than the audio signal energy according to the conventional method in low band frequencies. This means that the electronic device according to embodiments of the present disclosure is capable of outputting the audio signal having reduced audio quality distortion at the volume levels below the maximum level.

Figure 9:
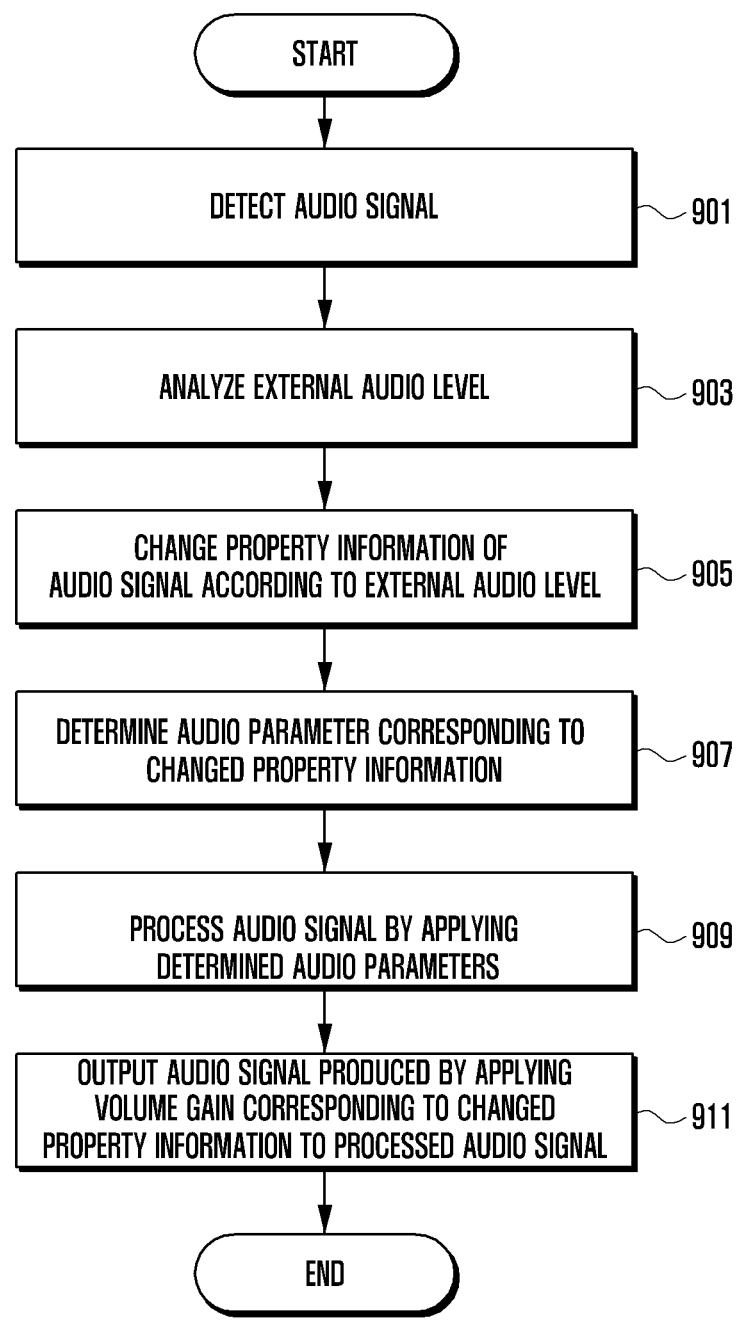
FIG. 9 is a flowchart illustrating an audio signal processing method according to embodiments of the present disclosure.

FIG. 9 is a flowchart illustrating an audio signal processing method according to embodiments of the present disclosure.

Referring to FIG. 9, the processor 160 may detect an audio signal at step 901. Since step 901 of FIG. 9 is identical to step 201 of FIG. 2, a detailed description thereof is omitted herein. If the audio signal is detected, the processor 160 may analyze the external audio level at step 903. For example, the processor 160 may collect external audio by means of an audio collecting device, e.g. the microphone 152. The processor 160 may collect the external audio continuously or periodically at a predetermined interval to measure the level of the external audio.

The processor 160 may change the property information of the audio according to the level of the external audio at step 905. For example, the processor 160 may change the volume level of the audio signal according to the level of the external audio. According to embodiments of the present disclosure, the processor 160 may decrease the volume level in a calm ambient state and increase the volume level in a noisy ambient state. That is, the processor 160 may adjust the volume level according to the size (or level) of the ambient noise. For example, the processor may adjust the volume level by referencing a table which maps the external audio levels, e.g. noise levels, and volume levels.

The processor 160 may determine the audio parameters corresponding to the changed property information (e.g., volume level) at step 907. According to embodiments of the present disclosure, it may be possible to determine the audio parameters by referencing Tables 1 and 2 based on the changed volume level. Since step 907 of FIG. 9 is identical to step 205 of FIG. 2, a detailed description thereof is omitted herein.

The processor 160 may process the audio signal by applying the determined audio parameters at step 909. According to embodiments of the present disclosure, the electronic device may apply the audio parameters corresponding to the volume level of the audio signal so as to output the audio signal without audio quality distortion.

The processor 160 may output the audio signal processed by applying the volume gain corresponding to the property information (e.g., volume level) to the audio signal processed with the audio parameters corresponding to the volume level changed according to the level of the external audio at step 911. According to embodiments of the present disclosure, the processor 160 may output the audio signal processed by applying the audio parameters and volume gain corresponding to the changed volume level through the speaker 151.

Figure 10:
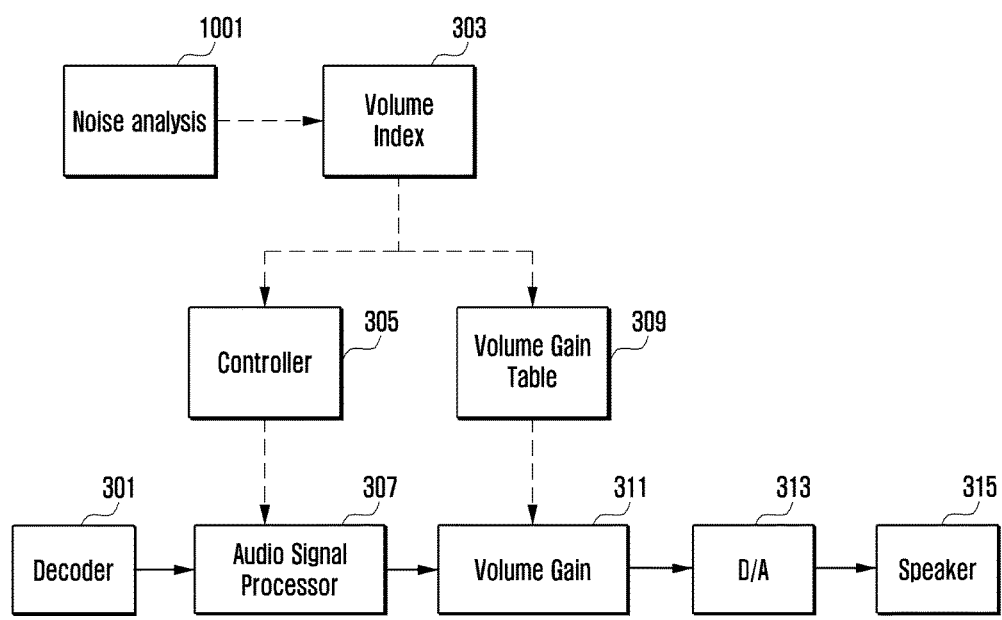
FIG. 10 is a block diagram illustrating a configuration of an electronic device for processing an audio signal according to embodiments of the present disclosure.

FIG. 10 is a block diagram illustrating a configuration of an electronic device for processing an audio signal according to embodiments of the present disclosure.

Detailed descriptions of the components of the electronic device of FIG. 10, which are identical to those of the electronic device of FIG. 3, are omitted herein.

Referring to FIG. 10, the noise analysis unit 1001 according to embodiments of the present disclosure may analyze external audio (e.g., noise) collected by means of the microphone 152. The processor 160 may configure a volume level corresponding to the analyzed external audio level.

According to embodiments of the present disclosure, the mapping table which maps the external audio levels and the volume levels may be stored in the memory 120. The processor 160 may determine the volume level of the audio signal based on the external audio level by referencing the mapping table. That is, the processor 160 may decrease or increase the current volume level according to the external audio level by referencing the mapping table.

According to embodiments of the present disclosure, if the level of the external audio collected by the microphone 512 is higher than a predetermined level (e.g., the noise level is high), the processor 160 may control to increase the volume level of the audio signal. If the level of the external audio collected by the microphone 512 is lower than the predetermined level (e.g., the noise level is low), the processor 160 may control to decrease the volume level of the audio signal. The audio signal is processed by means of the digital gain module 401, filter 403, AGC 405, and volume gain unit in correspondence to the volume level of the changed audio signal as described with reference to FIG. 3 and then outputted through the speaker 315 via the D/A 313.

Figure 11:
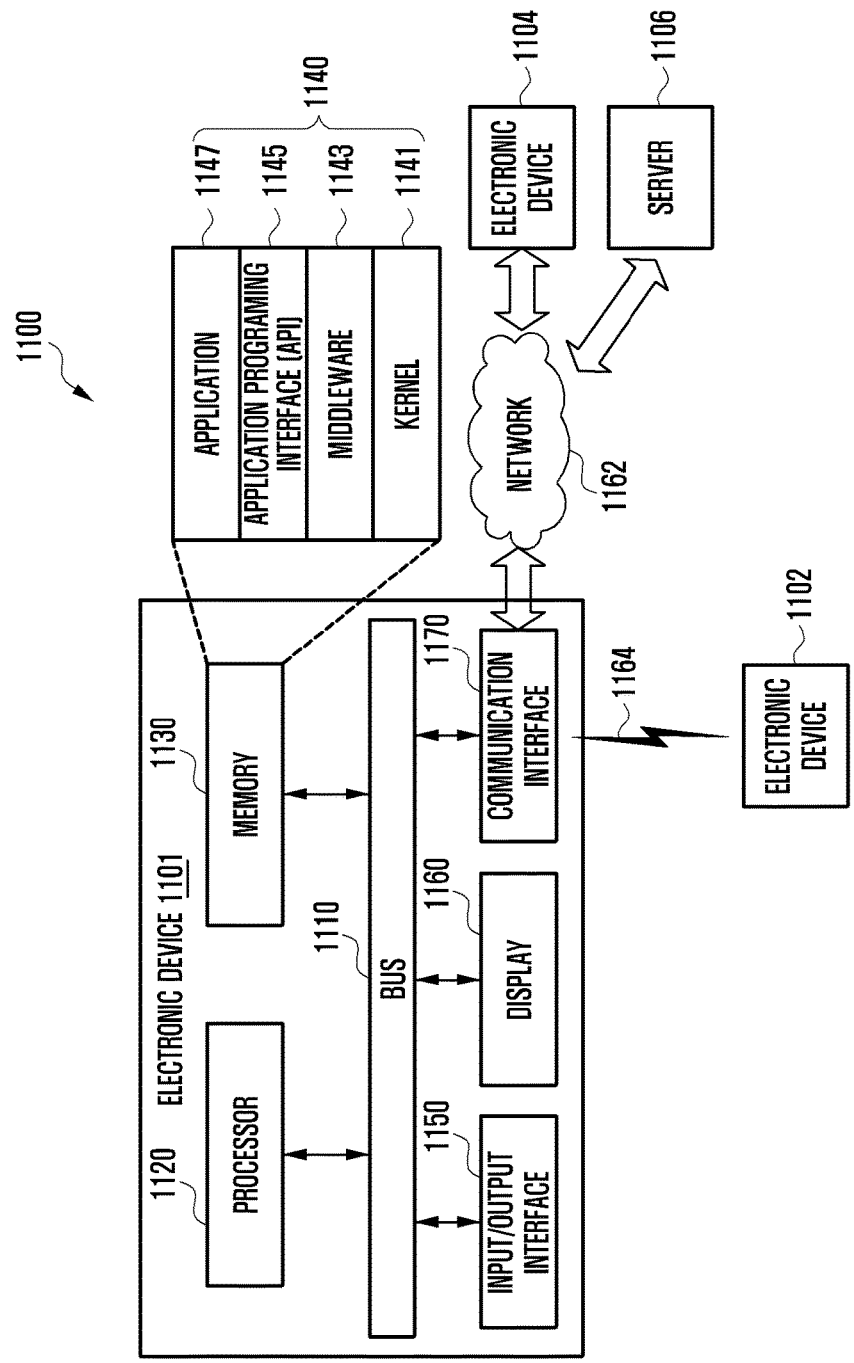
FIG. 11 is a block diagram illustrating a network environment according to embodiments of the present disclosure.

FIG. 11 illustrates a network environment including an electronic device according to embodiments of the present disclosure.

Referring to FIG. 11, an electronic device 1101, in a network environment 1100, includes a bus 1110, a processor 1120, a memory 1130, an input/output interface 1150, a display 1160, and a communication interface 1170. According to some embodiments of the present disclosure, the electronic device 1101 may one or more of the above-described components or further include one or more other additional components.

The bus 1110 may be a circuit connecting the above described components and transmitting communication (e.g., a control message) between the above described components.

The processor 1120 may include one or more of a CPU, an AP or a communication processor (CP). For example, the processor 1120 may control at least one component of the electronic device 1101 and/or execute calculation relating to communication or data processing.

The memory 1130 may include volatile and/or non-volatile memory. For example, the memory 1130 may store command or data relating to at least one component of the electronic device 1101. According to some embodiments of the present disclosure, the memory may store software and/or program 1140. For example, the program 140 may include a kernel 1141, middleware 1143, an application programming interface (API) 1145, and/or an application 1147, etc. At least one portion of the kernel 1141, the middleware 1143 and the API 1145 may be defined as operating system (OS).

The kernel 1141 controls or manages system resources (e.g., the bus 1110, the processor 1120, or the memory 1130) used for executing an operation or function implemented by the remaining other program, for example, the middleware 1143, the API 1145, or the application 1147. Further, the kernel 1141 provides an interface for accessing individual components of the electronic device 1101 from the middleware 1143, the API 1145, or the application 1147 to control or manage the components.

The middleware 1143 performs a relay function of allowing the API 1145 or the application 1147 to communicate with the kernel 1141 to exchange data. Further, in operation requests received from the application 1147, the middleware 1143 performs a control for the operation requests (e.g., scheduling or load balancing) by using a method of assigning a priority, by which system resources (e.g., the bus 1110, the processor 1120, the memory 1130 and the like) of the electronic device 1101 may be used, to the application 1147.

The API 1145 is an interface by which the application 1147 may control a function provided by the kernel 141 or the middleware 1142 and includes, for example, at least one interface or function (e.g., command) for a file control, a window control, image processing, or a character control.

The input/output interface 1150 may be interface to transmit command or data inputted by a user or another external device to another component(s) of the electronic device 101. Further, the input/output interface 1150 may output the command or data received from the another component(s) of the electronic device 101 to the user or the another external device.

The display 1160 may include, for example, liquid crystal display (LCD), light emitting diode (LED), organic LED (OLED), or micro electro mechanical system (MEMS) display, or electronic paper display. The display 160 may display, for example, various contents (text, image, video, icon, or symbol, and so on) to a user. The display 1160 may include a touch screen, and receive touch, gesture, approaching, or hovering input using a part of body of the user.

The communication interface 1170 may set communication of the electronic device 1101 and external device (e.g., a first external device 1102, a second external device 1104, or a server 1106). For example, the communication interface 1170 may be connected with the network 1162 through wireless communication or wire communication and communicate with the external device (e.g., a second external device 1104 or server 1106).

Wireless communication may use, as cellular communication protocol, at least one of LTE, LTE-A, CDMA, WCDMA, UMTS), WiBro, GSM, and the like, for example. A short-range communication 163 may include, for example, at least one of Wi-Fi, Bluetooth, NFC, magnetic secure transmission or near field magnetic data stripe transmission (MST), and GNSS, and the like. The GNSS may include at least one of, for example, a GPS, a global navigation satellite system (Glonass), a Beidou navigation satellite system (Beidou), and Galileo (European global satellite-based navigation system). Herein, the term "GPS" may be interchangeably used with the term "GNSS". Wired communication may include, for example, at least one of USB, HDMI, RS-232, POTS, and the like. The network 162 may include telecommunication network, for example, at least one of a computer network (e.g., a local area network (LAN) or a wide area network (WAN)), internet, and a telephone network.

Each of the first external device 1102 and the second external device 1104 may be same type or different type of device with the electronic device 1101. According to some embodiments of the present disclosure, the server 1106 may include one or more group of servers. At least one portion of executions executed by the electronic device may be performed by one or more electronic devices (e.g., external electronic device 1102, 1104, or server 1106). When the electronic device 1101 should perform a function or service automatically, the electronic device 1101 may request performing of at least one function to the another device (e.g., external electronic device 1102, 1104, or server 1106). For the above, cloud computing technology, distributed computing technology, or client-server computing technology may be used, for example.

Figure 12:
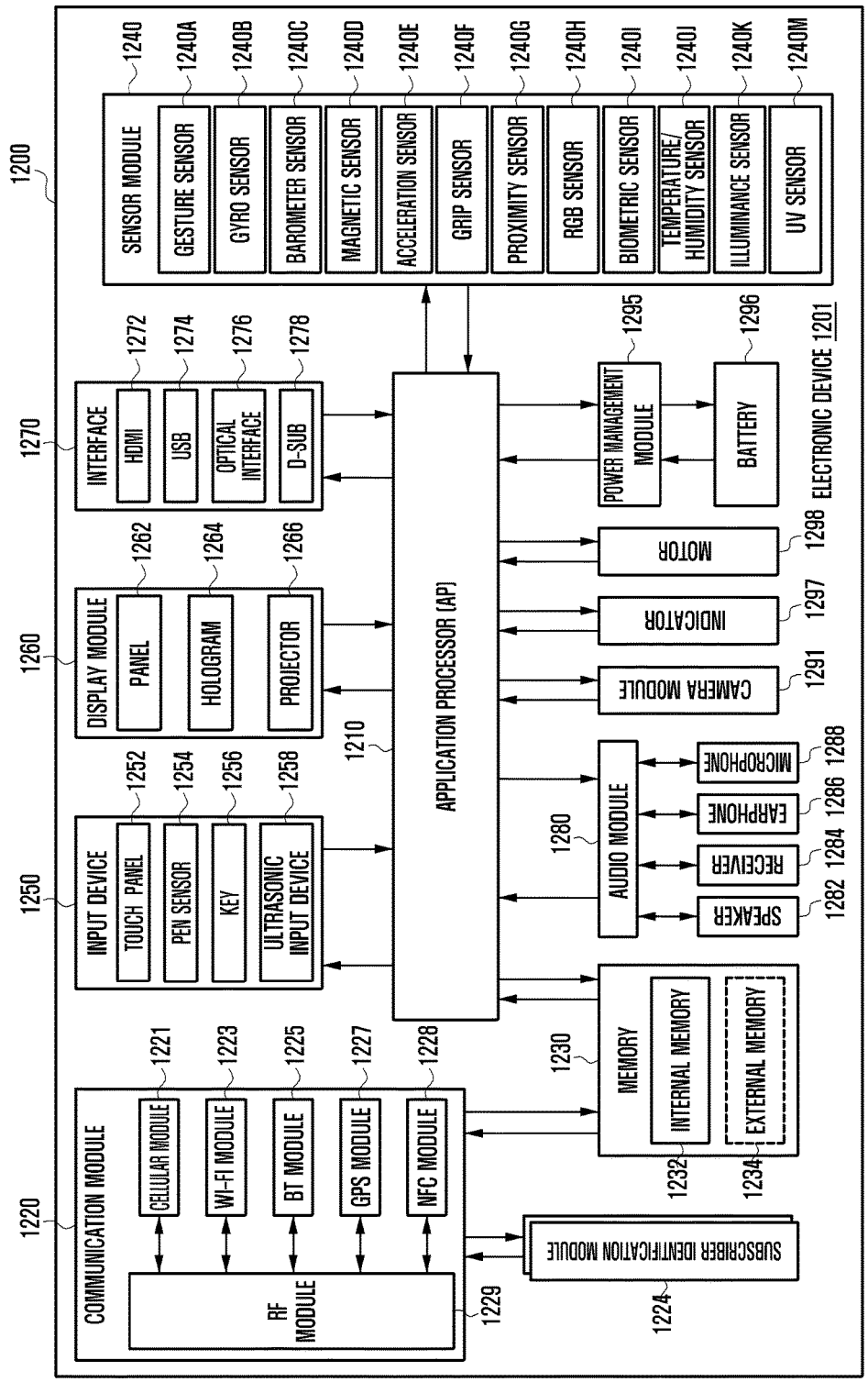
FIG. 12 is a block diagram illustrating a configuration of an electronic device according to embodiments of the present disclosure.

FIG. 12 illustrates a block diagram of an electronic device according to an embodiment of the present disclosure.

Referring to FIG. 12, an electronic device 1201 may configure, for example, a whole or a part of the electronic device 1101 illustrated in FIG. 11. The electronic device 1201 includes one or more APs 1210, a communication module 1220, a subscriber identification module (SIM) card 1224, a memory 1230, a sensor module 1240, an input device 1250, a display 1260, an interface 1270, an audio module 1280, a camera module 1291, a power managing module 1295, a battery 1296, an indicator 1297, and a motor 1298.

The AP 1210 operates an OS or an application program so as to control a plurality of hardware or software component elements connected to the AP 1210 and execute various data processing and calculations including multimedia data. The AP 1210 may be implemented by, for example, a system on chip (SoC). According to an embodiment of the present disclosure, the processor 1210 may further include a graphics processing unit (GPU) and/or image signal processor. The AP 1210 may include at least one portion of components illustrated in FIG. 12 (e.g., a cellular module 1221). The AP 1210 may load command or data received from at least one of another component (e.g., non-volatile memory), store various data in the non-volatile memory.

The communication module 1220 may include same or similar components with the communication interface 1160 of FIG. 11. The communication module 1220, for, example, may include the cellular module 1221, a Wi-Fi module 1223, a BT module 1225, a GPS module 1227, a NFC module 1228, and a radio frequency (RF) module 1229.

The cellular module 1221 provides a voice, a call, a video call, a short message service (SMS), or an internet service through a communication network (e.g., LTE, LTE-A, CDMA, WCDMA, UMTS, WiBro, GSM and the like). Further, the cellular module 1221 may distinguish and authenticate electronic devices within a communication network by using the SIM card 1224. According to an embodiment of the present disclosure, the cellular module 1221 performs at least some of the functions which may be provided by the AP 1210. For example, the cellular module 1221 may perform at least some of the multimedia control functions. The cellular module 1221 may include a CP.

Each of the Wi-Fi module 1223, the BT module 1225, the GPS module 1227, and the NFC module 1228 may include, for example, a processor for processing data transmitted/received through the corresponding module. Although the cellular module 1221, the Wi-Fi module 1223, the BT module 1225, the GPS module 1227, and the NFC module 1228 are at least some (e.g., two or more) elements of the cellular module 1221, the Wi-Fi module 1223, the BT module 1225, the GPS module 1227, and the NFC module 1228 may be included in one integrated chip (IC) or one IC package according to one embodiment of the present disclosure. For example, at least some (e.g., the CP corresponding to the cellular module 1221 and the Wi-Fi processor corresponding to the Wi-Fi module 1223) elements of the processors corresponding to the cellular module 1221, the Wi-Fi module 1223, the BT module 1225, the GPS module 1227, and the NFC module 1228 may be implemented by one SoC.

The RF module 1229 transmits/receives data, for example, an RF signal. The RF module 1229 may include, for example, a transceiver, a power amp module (PAM), a frequency filter, a low noise amplifier (LNA) and the like. Further, the RF module 1229 may further include a component for transmitting/receiving electronic waves over a free air space in wireless communication, for example, a conductor, a conducting wire, and the like. Although the cellular module 1221, the Wi-Fi module 1223, the BT module 1225, the GPS module 1227, and the NFC module 1228 share one RF module 1229 in FIG. 12, at least one of the cellular module 1221, the Wi-Fi module 1223, the BT module 1225, the GPS module 1227, and the NFC module 1228 may transmit/receive an RF signal through a separate RF module according to an embodiment of the present disclosure.

The SIM card 1224 includes a SIM and may be inserted into a slot formed in a particular portion of the electronic device. The SIM card 1224 includes unique identification information (e.g., integrated circuit card identifier (ICCID)) or subscriber information (e.g., international mobile subscriber identity (IMSI)).

The memory 1230 (e.g., memory 1130) may include an internal memory 1232 or an external memory 1234. The internal memory 1232 may include, for example, at least one of a volatile memory (e.g., a random access memory (RAM), a dynamic RAM (DRAM), a static RAM (SRAM), a synchronous dynamic RAM (SDRAM), and the like), and a non-volatile memory (e.g., a read only memory (ROM), a one time programmable ROM (OTPROM), a programmable ROM (PROM), an erasable and programmable ROM (EPROM), an electrically erasable and programmable ROM (EEPROM), a mask ROM, a flash ROM, a not and (NAND) flash memory, a not or (NOR) flash memory, and the like).

According to an embodiment of the present disclosure, the internal memory 1232 may be a solid state drive (SSD).

The external memory 1234 may further include a flash drive, for example, a compact flash (CF), a secure digital (SD), a micro-SD, a mini-SD, an extreme digital (xD), or a memory stick. The external memory 1234 may be functionally connected to the electronic device 1201 through various interfaces. The electronic device 1201 may further include a storage device (or storage medium) such as a hard drive.

The sensor module 1240 measures a physical quantity or detects an operation state of the electronic device 1201, and converts the measured or detected information to an electronic signal. The sensor module 1240 may include, for example, at least one of a gesture sensor 1240A, a gyro sensor 1240B, an atmospheric pressure (barometric) sensor 1240C, a magnetic sensor 1240D, an acceleration sensor 1240E, a grip sensor 1240F, a proximity sensor 1240G, a color sensor 1240H (e.g., a red, green, and blue (RGB) sensor) 1240H, a biometric sensor 1240I, a temperature/humidity sensor 1240J, an illumination (light) sensor 1240K, and a ultraviolet (UV) sensor 1240M. Additionally or alternatively, the sensor module 1240 may include, for example, an E-nose sensor, an electromyography (EMG) sensor, an electroencephalogram (EEG) sensor, an electrocardiogram (ECG) sensor, an infrared (IR) sensor, an iris sensor, a fingerprint sensor, and the like. The sensor module 1240 may further include a control circuit for controlling one or more sensors included in the sensor module 1240.

The input device 1250 includes a touch panel 1252, a digital pen sensor 1254, a key 1256, and an ultrasonic input device 1258. For example, the touch panel 1252 may recognize a touch input in at least one type of a capacitive type, a resistive type, an infrared type, and an acoustic wave type. The touch panel 1252 may further include a control circuit. In the capacitive type, the touch panel 1252 may recognize proximity as well as a direct touch. The touch panel 1252 may further include a tactile layer. In this event, the touch panel 1252 provides a tactile reaction to the user.

The digital pen sensor 1254 may be implemented, for example, using a method identical or similar to a method of receiving a touch input of the user, or using a separate recognition sheet. The key 1256 may include, for example, a physical button, an optical key, or a key pad. The ultrasonic input device 1258 is a device which may detect an acoustic wave by a microphone 1288 of the electronic device 1201 through an input means generating an ultrasonic signal to identify data and may perform wireless recognition. According to an embodiment of the present disclosure, the electronic device 1201 receives a user input from an external device (e.g., computer or server) connected to the electronic device 1201 by using the communication module 1220.

The display 1260 (e.g., display 1160) includes a panel 1262, a hologram device 1264, and a projector 1266. The panel 1262 may be, for example, a LCD or an active matrix OLED (AM-OLED). The panel 1262 may be implemented to be, for example, flexible, transparent, or wearable. The panel 1262 may be configured by the touch panel 1252 and one module. The hologram device 1264 shows a stereoscopic image in the air by using interference of light. The projector 1266 projects light on a screen to display an image. For example, the screen may be located inside or outside the electronic device 1201. According to an embodiment of the present disclosure, the display 1260 may further include a control circuit for controlling the panel 1262, the hologram device 1264, and the projector 1266.

The interface 1270 includes, for example, a HDMI 1272, an USB 1274, an optical interface 1276, and a D-subminiature (D-sub) 1278. The interface 1270 may be included in, for example, the communication interface 1170 illustrated in FIG. 11. Additionally or alternatively, the interface 1290 may include, for example, a mobile high-definition link (MHL) interface, an SD card/multi-media card (MMC), or an infrared data association (IrDA) standard interface.

The audio module 1280 bi-directionally converts a sound and an electronic signal. At least some components of the audio module 1280 may be included in, for example, the input/output interface 1150 illustrated in FIG. 11. The audio module 1280 processes sound information input or output through, for example, a speaker 1282, a receiver 1284, an earphone 1286, the microphone 1288 and the like.

The camera module 1291 is a device which may photograph a still image and a video. According to an embodiment of the present disclosure, the camera module 1291 may include one or more image sensors (e.g., a front sensor or a back sensor), an image signal processor (ISP) or a flash (e.g., an LED or xenon lamp).

The power managing module 1295 manages power of the electronic device 1201. The power managing module 1295 may include, for example, a power management integrated circuit (PMIC), a charger IC, or a battery gauge.

The PMIC may be mounted to, for example, an integrated circuit or an SoC semiconductor. A charging method may be divided into wired and wireless methods. The charger IC charges a battery and prevent over voltage or over current from flowing from a charger. According to an embodiment of the present disclosure, the charger IC includes a charger IC for at least one of the wired charging method and the wireless charging method. The wireless charging method may include, for example, a magnetic resonance method, a magnetic induction method and an electromagnetic wave method, and additional circuits for wireless charging, for example, circuits such as a coil loop, a resonant circuit, a rectifier and the like may be added.

The battery gauge measures, for example, a remaining quantity of the battery 1296, or a voltage, a current, or a temperature during charging. The battery 1296 may store or generate electricity and supply power to the electronic device 1201 by using the stored or generated electricity. The battery 1296 may include a rechargeable battery or a solar battery.

The indicator 1297 shows particular statuses of the electronic device 1201 or a part (e.g., AP 1210) of the electronic device 1201, for example, a booting status, a message status, a charging status and the like. The motor 1298 converts an electrical signal to a mechanical vibration. The electronic device 1201 may include a processing unit (e.g., a GPU) for supporting a module TV. The processing unit for supporting the mobile TV may process, for example, media data according to a standard of digital multimedia broadcasting (DMB), digital video broadcasting (DVB), media flow and the like.

Each of the components of the electronic device according to embodiments of the present disclosure may be implemented by one or more components and the name of the corresponding component may vary depending on a type of the electronic device. The electronic device may include at least one of the above described components, a few of the components may be omitted, or additional components may be further included. Also, some of the components of the electronic device may be combined to form a single entity, and thus may equivalently execute functions of the corresponding components before being combined.

Figure 13:
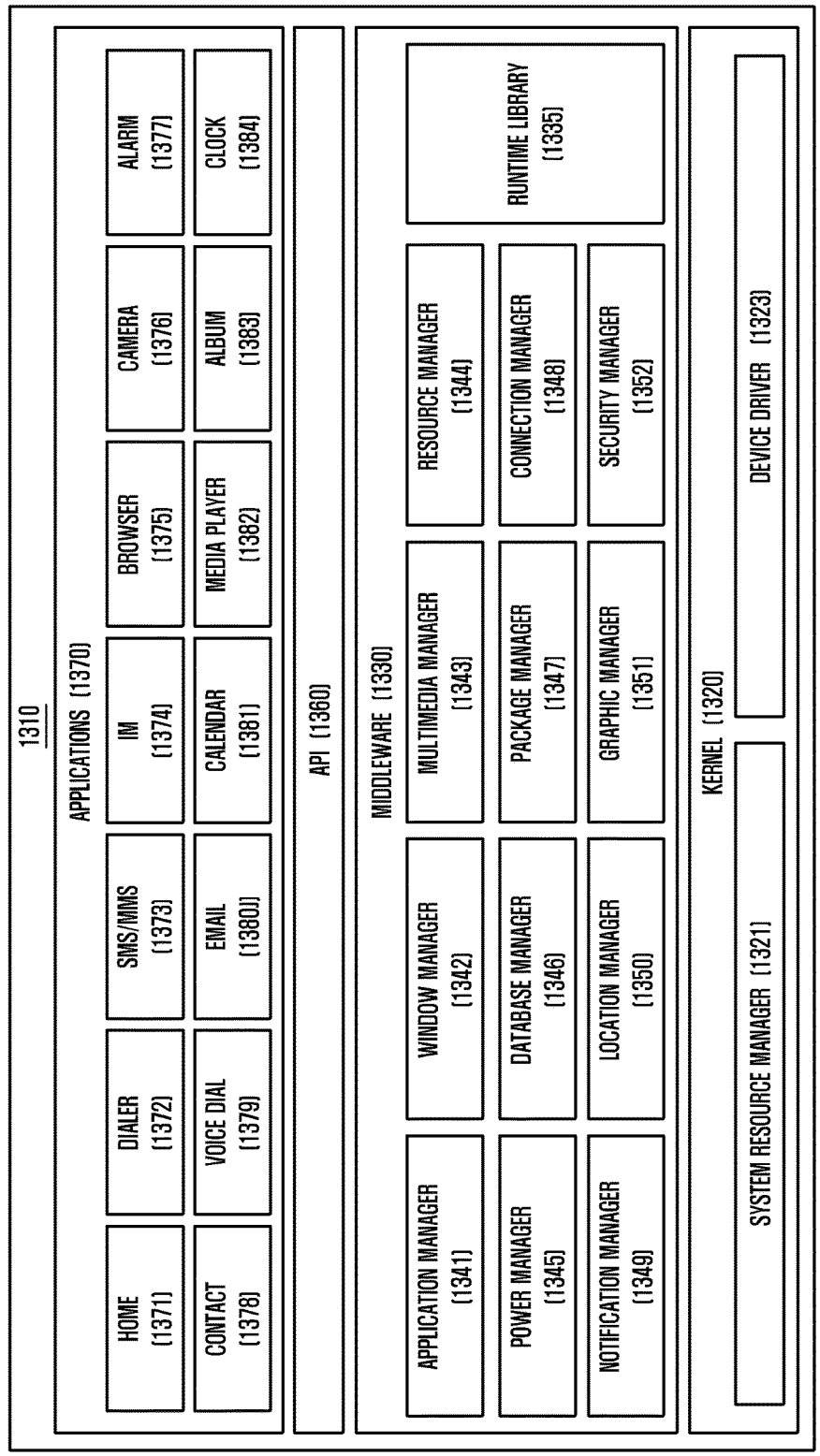
FIG. 13 is a block diagram illustrating a configuration of a program module according to embodiments of the present disclosure.

FIG. 13 is a block diagram illustrating a programming module according to an embodiment of the present disclosure.

Referring to FIG. 13, a programming module 1310 may be included, e.g. stored, in the electronic apparatus 1100, e.g.

the memory 1130, as illustrated in FIG. 11. At least a part of the programming module 1310 (e.g., program 1140) may be configured by software, firmware, hardware, and/or combinations of two or more thereof. The programming module 1310 may include an OS that is implemented in hardware, e.g., the hardware 1200 to control resources related to an electronic device, e.g., the electronic device 1100, and/or various applications. e.g., applications 1370, driven on the OS. For example, the OS may be Android, iOS, Windows, Symbian, Tizen, Bada, and the like. Referring to FIG. 13, the programming module 1310 may include a kernel 1320, middleware 1330, an API 1360, and the applications 1370 (e.g., application 1147). At least part of the program module 1310 may be preloaded on the electronic device or downloaded from a server (e.g., an electronic device 1102, 1104, server 1106, etc.).

The kernel 1320, which may be like the kernel 1141, may include a system resource manager 1321 and/or a device driver 1323. The system resource manager 1321 may include, for example, a process manager, a memory manager, and a file system manager. The system resource manager 1321 may control, allocate, and/or collect system resources. The device driver 1323 may include, for example, a display driver, a camera driver, a BT driver, a shared memory driver, a USB driver, a keypad driver, a Wi-Fi driver, and an audio driver. Further, according to an embodiment of the present disclosure, the device driver 1323 may include an inter-process communication (IPC) driver.

The middleware 1330 may include a plurality of modules implemented in advance for providing functions commonly used by the applications 1370. Further, the middleware 1330 may provide the functions through the API 1360 such that the applications 1370 may efficiently use restricted system resources within the electronic apparatus. For example, as shown in FIG. 13, the middleware 1330 may include at least one of a runtime library 1335, an application manager 1341, a window manager 1342, a multimedia manager 1343, a resource manager 1344, a power manager 1345, a database manager 1346, a package manager 1347, a connectivity manager 1348, a notification manager 1349, a location manager 1350, a graphic manager 1351, and a security manager 1352.

The runtime library 1335 may include a library module that a compiler uses in order to add a new function through a programming language while one of the applications 1370 is being executed. According to an embodiment of the present disclosure, the runtime library 1335 may perform an input/output, memory management, and/or a function for an arithmetic function.

The application manager 1341 may manage a life cycle of at least one of the applications 1370. The window manager 1342 may manage graphical user interface (GUI) resources used by a screen. The multimedia manager 1343 may detect formats used for reproduction of various media files, and may perform encoding and/or decoding of a media file by using a codec suitable for the corresponding format. The resource manager 1344 may manage resources such as a source code, a memory, and a storage space of at least one of the applications 1370.

The power manager 1345 may manage a battery and/or power, while operating together with a basic input/output system (BIOS), and may provide power information used for operation. The database manager 1346 may manage generation, search, and/or change of a database to be used by at least one of the applications 1370. The package manager 1347 may manage installation and/or an update of an application distributed in a form of a package file.

For example, the connectivity manager 1348 may manage wireless connectivity such as Wi-Fi or BT. The notification manager 1349 may display and/or notify of an event, such as an arrival message, a promise, a proximity notification, and the like, in such a way that does not disturb a user. The location manager 1350 may manage location information of an electronic apparatus. The graphic manager 1351 may manage a graphic effect which will be provided to a user, and/or a user interface related to the graphic effect. The security manager 1352 may provide all security functions used for system security and/or user authentication. According to an embodiment of the present disclosure, when an electronic apparatus, e.g., the electronic apparatus 1100, has a telephone call function, the middleware 1330 may further include a telephony manager for managing a voice and/or video communication function of the electronic apparatus.

The middleware 1330 may generate and use a new middleware module through various functional combinations of the aforementioned internal element modules. The middleware 1330 may provide modules specialized according to types of OSs in order to provide differentiated functions. Further, the middleware 1330 may dynamically remove some of the existing elements and/or add new elements. Accordingly, the middleware 1330 may exclude some of the elements described in the embodiments of the present disclosure, further include other elements, and/or substitute the elements with elements having a different name and performing a similar function.

The API 1360, which may be similar to the API 1133, is a set of API programming functions, and may be provided with a different configuration according to the OS. For example, in a case of Android or iOS, one API set may be provided for each of platforms, and when using Tizen, two or more API sets may be provided.

The applications 1370, which may include an application similar to the application 1134, may include, for example, a preloaded application and/or a third party application. The applications 1370 may include a home application 1371 a dialer application 1372, a SMS/multimedia messaging service (MMS) application 1373, an instant messaging (IM) application 1374, a browser application 1375, a camera application 1376, an alarm application 1377, a contact application 1378, a voice dial application 1379, an email application 1380, a calendar application 1381, a media player application 1382, an album application 1383, and a clock application 1384. However, embodiments of the present disclosure are not limited thereto, and the applications 1370 may include any other similar and/or suitable application.

At least a part of the programming module 1310 may be implemented by commands stored in computer-readable storage media. When the commands are executed by at least one processor, e.g. the processor 1210, at least one processor may perform functions corresponding to the commands. The computer-readable storage media may be, for example, the memory 1230. At least a part of the programming module 1310 may be implemented, e.g. executed, by, for example, the processor 1210. At least a part of the programming module 1310 may include, for example, a module, a program, a routine, a set of instructions, and/or a process for performing at least one function.

The titles of the aforementioned elements of the programming module, e.g. the programming module 1310, according to the present disclosure may vary depending on the type of the OS. The programming module according to the present disclosure may include at least one of the aforementioned elements and/or may further include other additional elements, and/or some of the aforementioned elements may be omitted. The operations performed by a programming module and/or other elements according to the present disclosure may be processed through a sequential, parallel, repetitive, and/or heuristic method, and some of the operations may be omitted and/or other operations may be added.

The term "module", as used in the present disclosure, may refer to, for example, a unit including at least one combination of hardware, software, and firmware. The term "module" may be interchangeably used with a term, such as unit, logic, logical block, component, and/or circuit. The module may be a minimum unit of an integrally configured article and/or a part thereof. The module may be a minimum unit performing at least one function and/or a part thereof. The module may be mechanically and/or electronically implemented. For example, the module, according to the present disclosure, may include at least one of an application-specific IC (ASIC) chip, a field-programmable gate arrays (FPGA), and a programmable-logic device for performing operations which has been known and/or are to be developed.

According to embodiments of the present disclosure, at least some of the devices (e.g., modules or functions thereof) or the method (e.g., operations) according to the present disclosure may be implemented by a command stored in a computer-readable storage medium in a programming module form. When the instructions are executed by at least one processor (e.g., the processor 120), the at least one processor may perform functions corresponding to the instructions. The computer-readable storage medium may be, for example, the memory 130. At least a part of the programming module may be implemented (e.g., executed) by, for example, the processor 120. At least some of the programming modules may include, for example, a module, a program, a routine, a set of instructions, or a process for performing one or more functions.

The computer-readable recording medium may include magnetic media such as a hard disk, a floppy disk, and a magnetic tape, optical media such as a compact disc ROM (CD-ROM) and a DVD, magneto-optical media such as a floptical disk, and hardware devices specially configured to store and perform a program instruction (e.g., programming module), such as a ROM, a RAM, a flash memory and the like. In addition, the program instructions may include high class language codes, which may be executed in a computer by using an interpreter, as well as machine codes made by a compiler. The aforementioned hardware device may be configured to operate as one or more software modules in order to perform the operation of the present disclosure, and vice versa.

The module or programming module of the present disclosure may include at least one of the aforementioned components with omission of some components or addition of other components. The operations of the modules, programming modules, or other components may be executed in series, in parallel, recursively, or heuristically. Also, some operations may be executed in different order, omitted, or extended with other operations.

As described above, the audio processing methods and electronic devices for supporting the same according to embodiments of the present disclosure are advantageous in terms of applying an audio parameter per volume level of the audio signal. This makes it possible to output the sound of which volume and quality distortion is reduced even at the volume levels lower than the maximum level. The audio processing methods and electronic devices for supporting the same according to embodiments of the present disclosure are advantageous in terms of providing users with audio of the quality suitable for the current volume level.

Although the audio processing method and electronic device for supporting the same according to embodiments of the present disclosure have been described using specific terms, the specifications and drawings are to be regarded in an illustrative rather than a restrictive sense in order to help understand the present disclosure. Thus the scope of the disclosure should be determined by the appended claims and their legal equivalents rather than the specification, and various alterations and modifications within the definition and scope of the claims are included in the claims.

What is claimed is:

1. An electronic device, comprising:
a memory for storing a first audio signal process and a second audio signal process for processing an audio signal; and
a processor functionally connected to the memory,
wherein the processor performs the first audio signal process by applying predetermined audio parameters to the audio signal to be output through a speaker in response to a request to play the audio signal, checks property information of the audio signal, performs the second audio signal process to the audio signal processed by the first audio signal process when the property information fulfills one of a first condition and a second condition, the second audio signal process comprises a first process and a second process, and outputs the audio signal processed using the second audio signal process through the speaker,
wherein the processor processes, when the checked property information fulfills the first condition, the audio signal using the first process, and processes, when the property information fulfills the second condition, the audio signal using the second process,
wherein the first audio signal process optimizes at least one audio parameter value at each volume level of a plurality of volume levels based on the audio signal, and
wherein the first audio signal process applies an excessive volume gain to the audio signal at a maximum volume level and applies excessive compression to the audio signal for protection against audio signal saturation.

2. The electronic device of claim 1, wherein the property information of the audio signal comprises volume level information, audio channel information, audio quality information, and audio type information.

3. The electronic device of claim 2, wherein the first and second processes process the audio signal using audio parameters and volume gain corresponding to the first and second conditions.

4. The electronic device of claim 3, wherein:
the memory stores an audio parameter table that maps the property information of the audio signal to the audio parameters, and
the processor determines the audio parameters corresponding to the conditions of the property information by referencing the audio parameter table and applies the audio parameters to the audio signal.

5. The electronic device of claim 4, wherein:
the audio parameters comprise a digital gain, a filter, and an auto gain control (AGC), and
the audio parameter table comprises different digital gain, filter, and AGC values for each of the first and second conditions of the property information.

6. The electronic device of claim 4, wherein:
the memory stores a volume gain table that maps the property information of the audio signal to the volume gain, and
the processor determines the volume gain corresponding to each of the first and second conditions of the property information by referencing the volume gain table stored in the memory and applies the volume gain to the audio signal to which the audio parameters apply.

7. The electronic device of claim 2, further comprising a microphone for collecting external audio, and
wherein the processor analyzes a level of the external audio collected by the microphone.

8. The electronic device of claim 7, wherein the memory stores an external audio level table which maps the level of the external audio to an audio volume level.

9. The electronic device of claim 8, wherein the processor adjusts the volume level of the property information to the audio volume level corresponding to the level of the external audio by referencing the external audio level table stored in the memory.

10. An audio signal processing method, comprising:
performing a first audio signal process by applying predetermined audio parameters to an audio signal to be output through a speaker in response to a request to play the audio signal;
checking property information of the audio signal;
performing a second audio signal process to the audio signal processed by the first audio signal process when the property information fulfills one of a first condition and a second condition, the second audio signal process comprises a first process and a second process; and
outputting the audio signal processed using one of the first and second processes through the speaker,
wherein performing the second audio signal process comprises:
processing, when the checked property information fulfills the first condition, the audio signal using the first process; and
processing, when the property information fulfills the second condition, the audio signal using the second process,
wherein the first audio signal process optimizes at least one audio parameter value at each volume level of a plurality of volume levels based on the audio signal, and
wherein the first audio signal process applies an excessive volume gain to the audio signal at a maximum volume level and applies excessive compression to the audio signal for protection against audio signal saturation.

11. The audio signal processing method of claim 10, wherein:
the property information of the audio signal comprises volume level information, audio channel information, audio quality information, and audio type information, and
the first process processes the audio signal using audio parameters and volume gain corresponding to the first condition of the property information, and the second process processes the audio signal using the audio parameters and volume gain corresponding to the second condition of the property information.

12. The audio signal processing method of claim 11, wherein checking the property information comprises determining the audio parameters corresponding to each of the first and second conditions of the property information by referencing an audio parameter table that maps the property information to the audio parameters.

13. The audio signal processing method of claim 12, wherein the audio parameters comprise a digital gain, a filter, and an auto gain control (AGC).

14. The audio signal processing method of claim 13, wherein the audio parameter table comprises different digital gain, filter, and AGC values for each of the first and second conditions of the property information.

15. The audio signal processing method of claim 12, wherein determining the audio parameters comprises determining the volume gain corresponding to each of the first and second conditions of the property information by referencing the volume gain table which maps the property information of the audio signal to the volume gain.

16. The audio signal processing method of claim 11, further comprising analyzing a level of external audio before checking the property information of the audio signal.

17. The audio signal processing method of claim 16, wherein:
checking the property information of the audio signal comprises determining an audio volume level corresponding to the external audio volume level by referencing an extra audio level table that maps the external audio level to the audio volume level, and
determining the volume level comprises adjusting the audio volume level of the property information to the audio volume level corresponding to the external audio level.

* * * * *